(12) United States Patent
Sutardja

(10) Patent No.: US 8,149,626 B2
(45) Date of Patent: *Apr. 3, 2012

(54) THRESHOLD VOLTAGE DIGITIZER FOR ARRAY OF PROGRAMMABLE THRESHOLD TRANSISTORS

(75) Inventor: Pantas Sutardja, Los Gatos, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 13/224,823

(22) Filed: Sep. 2, 2011

(65) Prior Publication Data

US 2011/0310672 A1 Dec. 22, 2011

Related U.S. Application Data

(63) Continuation of application No. 12/883,214, filed on Sep. 16, 2010, now Pat. No. 8,014,206, which is a continuation of application No. 12/193,380, filed on Aug. 18, 2008, now Pat. No. 7,800,951.

(60) Provisional application No. 60/965,535, filed on Aug. 20, 2007.

(51) Int. Cl.
*G11C 16/06* (2006.01)

(52) U.S. Cl. ......... 365/185.19; 365/189.04; 365/185.21; 365/230.06; 365/196

(58) Field of Classification Search ............. 365/185.19, 365/189.04, 185.24, 185.21, 230.06, 196
See application file for complete search history.

(56) References Cited

U.S. PATENT DOCUMENTS

| 5,751,635 | A | 5/1998 | Wong et al. |
| 5,754,475 | A | 5/1998 | Bill et al. |
| 6,392,931 | B1 | 5/2002 | Pasotti et al. |
| 7,471,567 | B1 | 12/2008 | Lee et al. |
| 7,800,951 | B2 | 9/2010 | Sutardja |
| 2003/0202389 | A1* | 10/2003 | Werner et al. ................. 365/200 |
| 2006/0028872 | A1 | 2/2006 | Rolandi et al. |
| 2009/0003069 | A1 | 1/2009 | Lee et al. |

FOREIGN PATENT DOCUMENTS

| EP | 1 729 302 | 6/2006 |
| EP | 1 729 302 A | 12/2006 |

OTHER PUBLICATIONS

The International Search Report and Written Opinion of the International Searching Authority for corresponding International Application No. PCT/US2008/073716 filed Aug. 20, 2008; 17 pages.
International Search Report and the Written Opinion of the International Searching Authority, or the Declaration mailed Sep. 10, 2008 for international Application No. PCT/US2008/073716 filed Aug. 20, 2008; 17 pages.

* cited by examiner

*Primary Examiner* — Thong Q Le

(57) ABSTRACT

A method and system for determining a respective threshold voltage of each of a plurality of transistors in a memory array. The method includes: applying a ramp voltage to gates of the plurality of transistors, wherein the ramp voltage is configured to increase based on an incrementing digital code; as the ramp voltage is being applied, generating a respective control signal in response to sensing a predetermined threshold current along a respective bitline in the memory array, wherein each transistor in the memory array is in communication with a respective bitline in the memory array; and for each transistor in the memory array, latching a current value of the incrementing digital code in response to the respective control signal corresponding to the transistor being generated. The current value of the incrementing digital code latched by each register corresponds to the threshold voltage of the corresponding transistor.

14 Claims, 19 Drawing Sheets

US 8,149,626 B2

THRESHOLD VOLTAGE DIGITIZER FOR ARRAY OF PROGRAMMABLE THRESHOLD TRANSISTORS

CROSS-REFERENCE TO RELATED APPLICATIONS

This present disclosure is a continuation of U.S. patent application Ser. No. 12/883,214, filed on Sep. 16, 2010, which is a continuation of U.S. patent application Ser. No. 12/193,380 (now U.S. Pat. No. 7,800,951), filed on Aug. 18, 2008, which claims the benefit of U.S. Provisional Application No. 60/965,535, filed on Aug. 20, 2007.

FIELD

The present disclosure relates to semiconductor memory systems, and more particularly to digitizing threshold voltages of programmable threshold transistors used in memory arrays.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Memory integrated circuits (ICs) comprise memory arrays. The memory arrays include memory cells arranged in rows and columns. The memory cells in the rows and columns are addressed by word lines (WLs) that select the rows and bit lines (BLs) that select the columns. The memory ICs comprise WL and BL decoders that select the WLs and BLs, respectively, during read/write operations.

Referring now to FIG. 1, an IC 10 comprises a memory array 12, a WL decoder 16, a BL decoder 18, and a read/write (R/W) control module 19. The memory array 12 comprises memory cells 14 arranged in rows and columns as shown. The WL and BL decoders 16, 18 select the WLs and BLs, respectively, depending on the addresses of the memory cells 14 selected during read/write operations. The R/W control module 19 reads and writes data in the selected memory cells 14.

The memory cells 14 may include cells of nonvolatile memory such as NAND or NOR flash memory. Each memory cell 14 may be programmed to store N binary digits (bits) of information, where N is an integer greater than or equal to 1. Accordingly, each memory cell 14 may have $2^N$ states. To store N bits per cell, each memory cell 14 may comprise a transistor having $2^N$ programmable threshold voltages (hereinafter threshold voltages). The $2^N$ threshold voltages of the transistor represent the $2^N$ states of the memory cell 14, respectively. For example only, the transistor may include a floating-gate field-effect transistor (FET) or a silicon-oxide nitride-oxide semiconductor (SONOS) FET.

Referring now to FIGS. 2A-2C, a memory cell 14-$i$ may comprise a transistor 50 having a threshold voltage $V_T$. In FIG. 2A, the transistor 50 may comprise a floating gate G (hereinafter gate G), a source S, and a drain D. In FIG. 2B, a graph of drain current ($I_D$) versus gate-to-source voltage ($V_{GS}$) of the transistor 50 is shown. Typically, the threshold voltage $V_T$ of the transistor 50 is an intercept on the $V_{GS}$ axis for a predetermined value of the drain current. In other words, the threshold voltage $V_T$ is a value of $V_{GS}$ that generates the predetermined drain current. The predetermined drain current may also be called a reference current or a threshold current. The value of the predetermined drain current depends on the value of the threshold voltage $V_T$. The amount of charge stored in the gate G during a write operation determines the value of threshold voltage $V_T$, the value of the corresponding predetermined drain current, and the state of the memory cell 14-$i$. Typically, the threshold voltage $V_T$ and the corresponding predetermined drain current are proportional to the amount of charge stored in the gate G.

In FIG. 2C, for example, the transistor 50 may have two programmable threshold voltages $V_{T1}$ and $V_{T2}$ depending on the amount of charge stored in the gate G. When the amount of charge stored in the gate G is Q1, the threshold voltage of the transistor 50 is $V_{T1}$. When the amount of charge stored in the gate G is Q2, the threshold voltage of the transistor 50 is $V_{T2}$. Depending on the amount charge stored in the gate G, a gate voltage (i.e., $V_{GS}$) having a value greater than or equal to $V_{T1}$ or $V_{T2}$ may be necessary to turn on the transistor 50 (i.e., to generate the predetermined drain current).

The state of the memory cell 14 is read by measuring the threshold voltage $V_T$ of the transistor 50. The threshold voltage $V_T$ is measured by applying the gate voltage to the gate G and sensing the drain current. The drain current is sensed by applying a small voltage across the source S and the drain D of the transistor 50.

When the gate voltage is less than the threshold voltage $V_T$, the transistor 50 is off, and the drain current is low (approximately zero). When, however, the gate voltage is greater than or equal to the threshold voltage $V_T$, the transistor 50 turns on, and the drain current becomes high (i.e., equal to the predetermined drain current corresponding to the $V_T$). The value of the gate voltage that generates the high drain current represents the threshold voltage $V_T$ of the transistor 50.

In a memory array, if independent gate control were possible, a binary search algorithm can be used to measure the threshold voltage. The threshold voltage could be measured to N-bit accuracy in N search cycles, where N is an integer greater than 1. But in a typical memory array, all transistors whose threshold voltages are to be measured at approximately the same time have their gates attached to the same word lines. Thus, independent gate control necessary for independent binary search algorithm is not possible. Accordingly, for an N-bit threshold voltage measurement, the most convenient way to measure the threshold voltages of all transistors is by stepping through ($2^N-1$) voltages on the word lines, and determining the threshold voltage of the transistors when the drain currents of the transistors first exceed a predetermined (preprogrammed) value.

Referring now to FIGS. 3A-3D, the threshold voltage of the transistor 50 is measured as follows. For example only, the transistor 50 may have four threshold voltages $V_{T1}$ to $V_{T4}$, where $V_{T1} < V_{T2} < V_{T3} < V_{T4}$. Accordingly, the memory cell 14-$i$ may have one of four states 00, 01, 10, and 11.

In FIG. 3A, the R/W control module 19 comprises a staircase voltage generator 20 and current sensing amplifiers 22. The number of current sensing amplifiers is equal to the number of bit lines. For example, when the IC 10 comprises B bit lines, the current sensing amplifiers 22 include B current sensing amplifiers for B bit lines, respectively, where B is an integer greater than 1.

In FIG. 3B, the WL decoder 16 selects a word line comprising memory cells 14-1, 14-2, ..., 14-$i$, ..., and 14-$n$ (collectively memory cells 14) when the states of the memory cells are to be determined. Each of the memory cells 14 includes a transistor similar to the transistor 50. The transistors are shown as capacitances C that store the charge in the gates.

When a read operation begins, the staircase voltage generator 20 supplies a staircase voltage to the WL decoder 16. The WL decoder 16 inputs the staircase voltage to the selected word line. Accordingly, the staircase voltage is applied to the gates of the transistors on the selected word line.

The current sensing amplifiers 22 include one current sensing amplifier for each bit line. For example, a current sensing amplifier 22-$i$ communicates with a bit line BL-$i$ and senses the drain current that flows through the transistor 50 of the memory cell 14-$i$. The current sensing amplifier 22-$i$ senses the drain current by applying a small voltage across the source and the drain of the transistor 50. Each current sensing amplifier senses the drain current that flows through the respective one of the transistors of the memory cells 14. The R/W control module 19 measures the threshold voltages of the transistors based on the drain currents sensed by the respective current sensing amplifiers 22.

In FIG. 3C, the staircase voltage can be increased in ($2^N$–1) steps when the memory cells 14 have $2^N$ states each. In the example shown, N=2. Accordingly, the staircase voltage that can be increased in three steps.

Specifically, in a first step, the staircase voltage can be increased from zero to a first voltage that is slightly greater than $V_{T1}$. In a second step, the staircase voltage can be increased from the first voltage to a second voltage that is slightly greater than $V_{T2}$. In a third step, the staircase voltage can be increased from the second voltage to a third voltage that is slightly greater than $V_{T3}$. At each step, the current sensing amplifiers 22 measure the drain currents that flow through the memory cells 14. The first, second, and third voltages are sequentially applied to the gates of the transistors until the threshold voltages of the transistors are determined based the sensed drain currents.

More specifically, in the first step, the first voltage is applied to the gates of the transistors. The current sensing amplifiers 22 sense the drain currents that flow through the transistors. For example, if the drain current flowing through the transistor 50 is high, then the threshold voltage of the transistor 50 is $V_{T1}$, and the state of the memory cell 14-$i$ is the first state (e.g., 00). If, however, the sensed drain current is low, then the threshold voltage of the transistor 50 is greater than $V_{T1}$, and the state of the memory cell 14-$i$ is other than the first state.

The threshold voltage of the transistor 50 may be $V_{T2}$, $V_{T3}$, or $V_{T4}$. The state of the memory cell 14-$i$ may be the second state (e.g., 01), the third state (e.g., 10), or the fourth state (e.g., 11). Accordingly, at least one and at most two more attempts to determine the threshold voltage of the transistor 50 are necessary.

Next, in the second step, the staircase voltage is stepped up from the first to the second voltage, and the second voltage is applied to the gates of the transistors. The current sensing amplifiers 22 sense the drain currents that flow through the transistors. For example, if the drain current flowing through the transistor 50 is high, then the threshold voltage of the transistor 50 is $V_{T2}$, and the state of the memory cell 14-$i$ is the second state.

If, however, the sensed drain current is low, then the threshold voltage of the transistor 50 is greater than $V_{T2}$, and the state of the memory cell 14-$i$ is neither the first state nor the second state. The threshold voltage of the transistor 50 may be $V_{T3}$ or $V_{T4}$. The state of the memory cell 14-$i$ may be the third state or the fourth state. Accordingly, at least one more attempt to determine the threshold voltage of the transistor 50 is necessary.

Finally, in the third step, the staircase voltage is stepped up from the second to the third voltage, and the third voltage is applied to the gates of the transistors. The current sensing amplifiers 22 sense the drain currents flowing through the transistors. For example, if the drain current flowing through the transistor 50 is high, then the threshold voltage of the transistor 50 is $V_{T3}$, and the state of the memory cell 14-$i$ is the third state. If, however, the sensed drain current is low, then the threshold voltage of the transistor 50 is $V_{T4}$, and the state of the memory cell 14-$i$ is the fourth state.

Thus, ($2^N$–1) attempts or trials are necessary to measure the threshold voltages of the transistors having $2^N$ threshold voltages each. That is, ($2^N$–1) attempts are necessary to measure the states of the memory cells 14 when the memory cells 14 have $2^N$ states each. As the value of N increases, the number of attempts necessary to measure the threshold voltages also increases. Consequently, the time taken to measure the threshold voltages (and the states of the memory cells 14) increases as the value of N increases.

Additionally, the transistors of the memory cells 14 and segments of the selected WL between adjacent memory cells 14 act as capacitances and resistances, respectively, as shown in FIG. 3B. Accordingly, the selected WL comprises a series of RC circuits as shown. As the distance of the memory cell 14-$i$ increases from the WL decoder 16, the settling time of the transistor 50 increases. The settling time is the time taken by the $V_{GS}$ of the transistor 50 to settle to the staircase voltage input to the gate G.

For example, in FIG. 3C, the settling time $T_{s1}$ of $V_{GS}$ of a first transistor on the selected word line is shown. The first transistor is a transistor of the memory cell 14-1 that is adjacent to the WL decoder 16. When the first voltage is applied to the gate of the first transistor, the $V_{GS}$ of the first transistor rises and settles to a value equal to the first voltage after time $T_{s1}$. The current sensing amplifier that measures the drain current that flows through the first transistor must wait for a time period equal to $T_s$, for the $V_{GS}$ to settle before measuring the drain current. The step of waiting for the settling time before sensing the drain current is repeated for each subsequent stepped up voltage if necessary until the threshold voltage of the first transistor is determined.

In FIG. 3D, the settling time $T_{sn}$ of $V_{GS}$ of a last transistor on the selected WL is shown. The last transistor is a transistor of the last memory cell 14-$n$. When the first voltage is applied to the gates of the transistors on the selected WL, the $V_{GS}$ of the last transistor rises and settles to a value equal to the first voltage after time $T_{sn}$, where $T_{sn} \gg T_{s1}$. The current sensing amplifier that senses the drain current that flows through the last transistor waits for a time period equal to $T_{sn}$ before measuring the drain current. The step of waiting for the settling time before sensing the drain current is repeated for each subsequent stepped up voltage if necessary until threshold voltage of the last transistor is determined. As can be appreciated, the value of $T_{sn}$ and the time taken to measure the threshold voltage of the last transistor (and the state of the last memory cell 14-$n$) increases as the number of memory cells 14 on the word line increases.

As the memory capacity of the memory ICs increases, the value of N (i.e., the number of bits per memory cell) and/or the number of memory cells per word line increases. Accordingly, the value of ($2^N$–1) and/or $T_{sn}$ increases. Consequently, the time taken to measure the threshold voltages of the transistors (and the states of the memory cells 14) on the selected word line increases.

Since today's memory ICs can be quite large in capacity, the loading and thus the settling time constant for the gate control voltage can be quite large. For example, in a 2 GB NAND memory IC, each row in the memory array may contain more than 100 thousands memory transistors. Together with a relatively high word line resistance, the word line settling time is typically in the range of microseconds to tens of microseconds. Bit line sensing cannot be done until the control voltage applied to the gate has settled sufficiently. The bit line current sensing amplifiers usually have to wait for multiple time constants of the word line control voltage before starting to sense the drain current via the bit line.

Presently, the highest maximum number of bits stored in the form of threshold voltage is two. For read-sensing, the number of bits required for digitization is typically the same as the number of bits stored in the threshold voltage values. Thus, for example, a total of $(2^2-1)=3$ control voltages need to be applied for digitization purpose. The digitizing speed is thus no less than 3 times the time required for the row-line to adequately settle.

To store more bits in the form of the threshold voltage of a transistor, the digitizer resolution will also need to be increased. Increasing the storage bits from 2 to 3 per transistor increases the number of control voltages from 3 to 7. For memory systems that uses soft information and signal processing to improve data error rate, even more bits are required from the read-digitizer. Accordingly, if the read-digitization is limited by the word line settling time, the read time of high resolution memory devices will increase exponentially.

SUMMARY

In general, in one aspect, the present disclosure describes a memory integrated circuit. The memory integrated circuit includes a memory array having a plurality of memory cells arranged along a wordline within the memory array, in which each memory cell respectively comprises a transistor having a threshold voltage. The memory integrated circuit further includes a wordline decoder configured to input a ramp voltage to the wordline so that the ramp voltage is applied to gates of the plurality of transistors on the wordline. The ramp voltage being applied to the gates of the plurality of transistors is configured to increase based on an incrementing digital code.

The memory integrated circuit further includes a plurality of current sensing amplifiers, in which each current sensing amplifier is respectively in communication with a corresponding transistor in the memory array along a respective bit line within the memory array, and each current sensing amplifier is configured to generate a control signal in response to sensing a predetermined threshold current along the respective bitline. The memory integrated circuit further includes a plurality of registers, wherein each register corresponds respectively to a corresponding transistor in the memory array, and wherein each register is configured to latch a current value of the incrementing digital code in response to the current sensing amplifier in communication with the corresponding transistor generating the control signal. The current value of the incrementing digital code latched by each register corresponds to the threshold voltage of the corresponding transistor.

In general, in another aspect, this specification describes a method for determining a respective threshold voltage of each of a plurality of transistors in a memory array, wherein the memory array includes a plurality of memory cells arranged along a wordline within the memory array, and wherein each memory cell respectively comprises a transistor of the plurality of transistor. The method includes: applying a ramp voltage to gates of the plurality of transistors on the wordline, wherein the ramp voltage being applied to the gates of the plurality of transistors is configured to increase based on an incrementing digital code; as the ramp voltage is being applied to the gates of the plurality of transistors, generating a respective control signal in response to sensing a predetermined threshold current along a respective bitline in the memory array, wherein each transistor in the memory array is in communication with a respective bitline in the memory array; and for each transistor in the memory array, latching a current value of the incrementing digital code in response to the respective control signal corresponding to the transistor being generated. The current value of the incrementing digital code latched by each register corresponds to the threshold voltage of the corresponding transistor.

In still other features, a computer program executed by a processor comprises outputting a first voltage, which is generated based on received codewords, to a first word line that communicates with N transistors each having programmable threshold voltages, where N is an integer greater than 1. The computer program further comprises sensing currents through the N transistors via N bit lines, respectively, and generating control signals when current through a corresponding one of the N transistors is greater than or equal to a predetermined current. The computer program further comprises determining one of the codewords for one of the N transistors when a corresponding one of the control signals is generated. The computer program further comprises generating measured values of the threshold voltages of the N transistors by compensating the ones of the codewords based on at least one of a position of the corresponding ones of the N transistors and a temperature.

In another feature, the computer program further comprises generating the first voltage that includes a linear ramp voltage. In another feature, the computer program further comprises synchronizing the N control signals to a clock that is used to generate the codewords. In other features, the computer program further comprises converting the codewords to Gray-code codewords, storing one of the Gray-code codewords for one of the N transistors when the corresponding one of the N control signals is generated, and converting one of the Gray-code codewords to one of the codewords.

In other features, the computer program further comprises programming each of N reference transistors of a reference word line to a predetermined threshold voltage. The computer program further comprises outputting the first voltage and a second voltage at first and second times, respectively, to the reference word line based on the temperature. The computer program further comprises sensing currents through the N reference transistors via the N bit lines, respectively. The computer program further comprises storing second and third ones of the codewords for each one of the N reference transistors when the first and second voltages are output, respectively, and when current through a corresponding one of the N reference transistors is greater than or equal to the predetermined current.

In another feature, the computer program of further comprises generating the first and second voltages that include first and second linear ramp voltages, respectively, and generating the second linear ramp voltage having a slower ramp rate than the first linear ramp voltage. In another feature, the computer program further comprises generating compensation values for the N bit lines based on differences between the second and third ones of the codewords for each one of the N reference transistors, respectively, and generating the measured values based on the compensation values.

In other features, the computer program further comprises generating the codewords using a counter, generating the first and second voltages by converting the codewords using a digital-to-analog converter (DAC), and incrementing the counter at a different rate when generating the second voltage than when generating the first voltage. In another feature, the computer program further comprises determining states of N memory cells that include the N transistors based on the ones of the codewords, respectively.

In still other features, a computer program executed by a processor comprises programming N reference transistors of a reference word line to a predetermined threshold voltage, where N is an integer greater than 1. The computer program further comprises generating first and second ramp voltages based on received codewords. The second ramp voltage has a slower ramp rate than the first ramp voltage. The computer program further comprises selectively outputting the first and second ramp voltages to the reference word line at first and second times, respectively. The computer program further comprises sensing currents through the N reference transistors via N bit lines, respectively. The computer program further comprises determining first and second ones of the codewords for one of the N reference transistors when the first and second ramp voltages are output, respectively, and when current through one of the N reference transistors is greater than or equal to a predetermined current. The computer program further comprises generating compensation values for the N bit lines based on the first and second ones of the codewords for the N reference transistors, respectively.

In another feature, the computer program further comprises generating the compensation values by subtracting the second ones of the codewords from the first ones of the codewords for the N reference transistors, respectively. In another feature, the computer program further comprises outputting the first and second ramp voltages to the reference word line when the N reference transistors reach a predetermined temperature.

In other features, the computer program further comprises outputting the first ramp voltage to a second word line that communicates with second N transistors having programmable threshold voltages. The computer program further comprises sensing currents through the second N transistors via the N bit lines, respectively. The computer program further comprises determining a third one of the codewords for one of the second N transistors when current through one of the second N transistors is greater than or equal to the predetermined current. The computer program further comprises generating measured values of the threshold voltages by subtracting the compensation values from the third ones of the codewords, respectively. In another feature, the computer program further comprises converting the codewords to Gray-code codewords.

In other features, the computer program further comprises generating the codewords using a counter, generating the first and second ramp voltages converting the codewords using a digital-to-analog converter (DAC), and incrementing the counter at a different rate when generating the second ramp voltage than when generating the first ramp voltage.

Further areas of applicability of the present disclosure will become apparent from the detailed description, the claims and the drawings. It should be understood that the detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
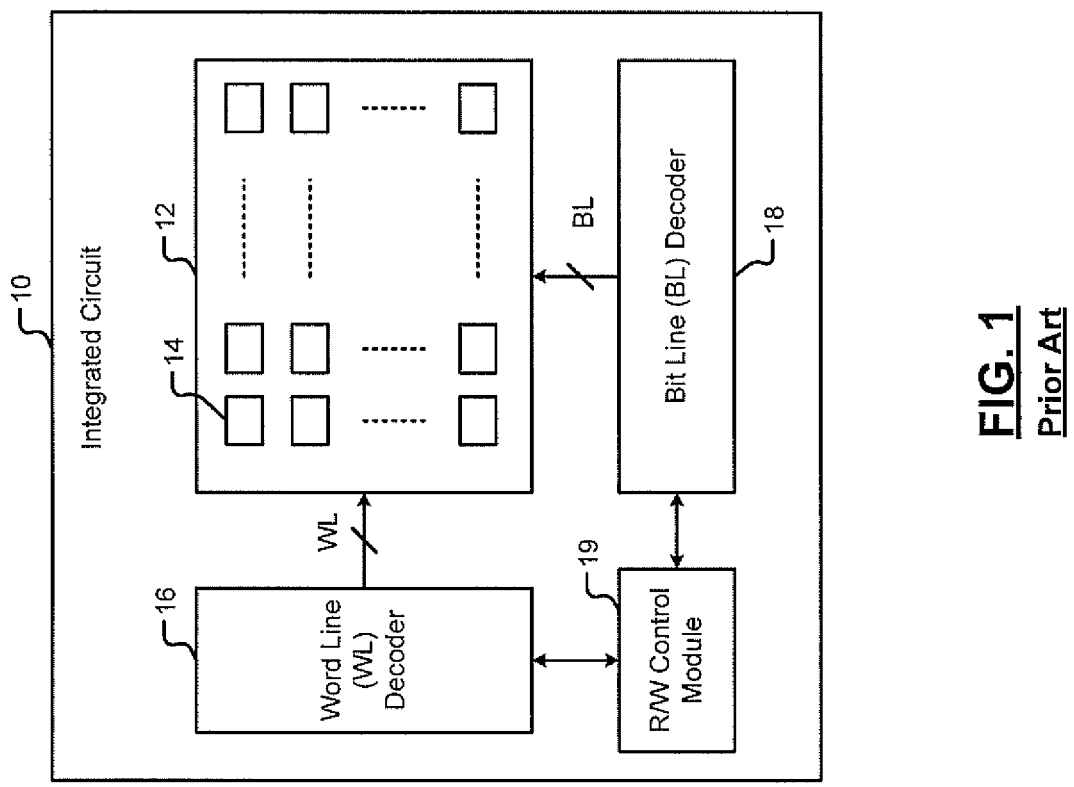
FIG. 1 is a functional block diagram of a memory integrated circuit (IC) according to the prior art.
Figure 2A:
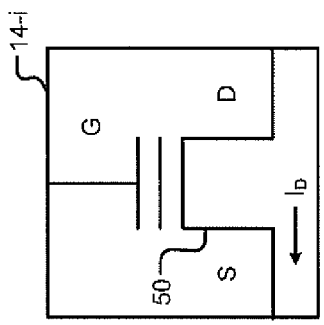
FIG. 2A is a schematic of a memory cell comprising a transistor having a plurality of programmable threshold voltages according to the prior art.
Figure 2B:
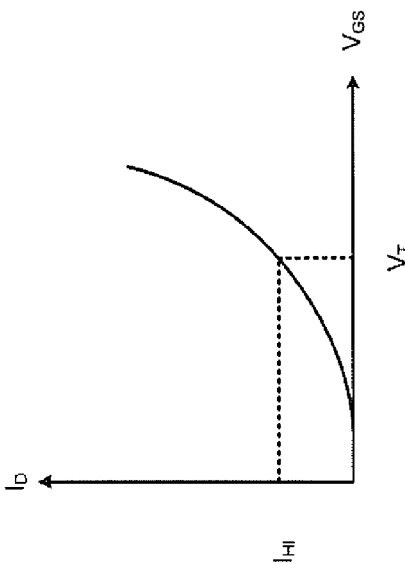
FIG. 2B is a graph of drain current versus gate-to-source voltage of the transistor of FIG. 2A.
Figure 2C:
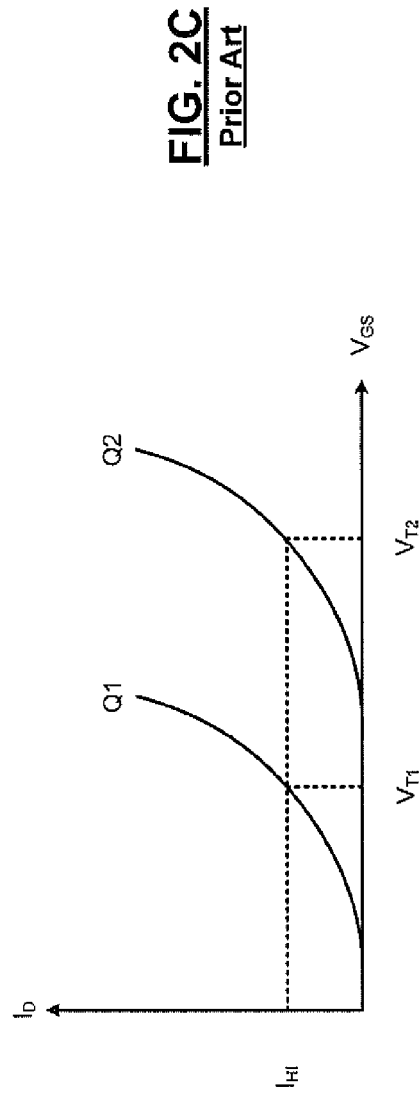
FIG. 2C is a graph of drain current ($I_D$) versus gate-to-source voltage ($V_{GS}$) of the transistor of FIG. 2A.
Figure 3A:
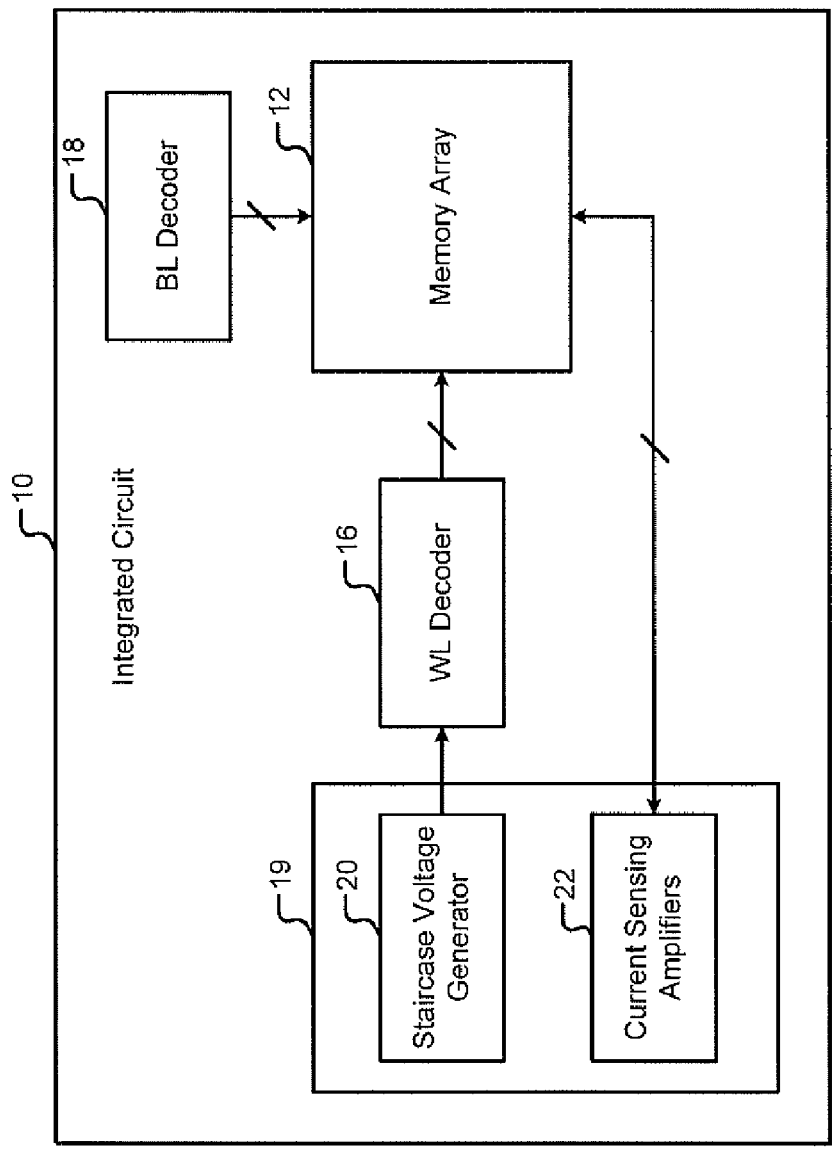
FIG. 3A is a functional block diagram of a memory IC according to the prior art.
Figure 3B:
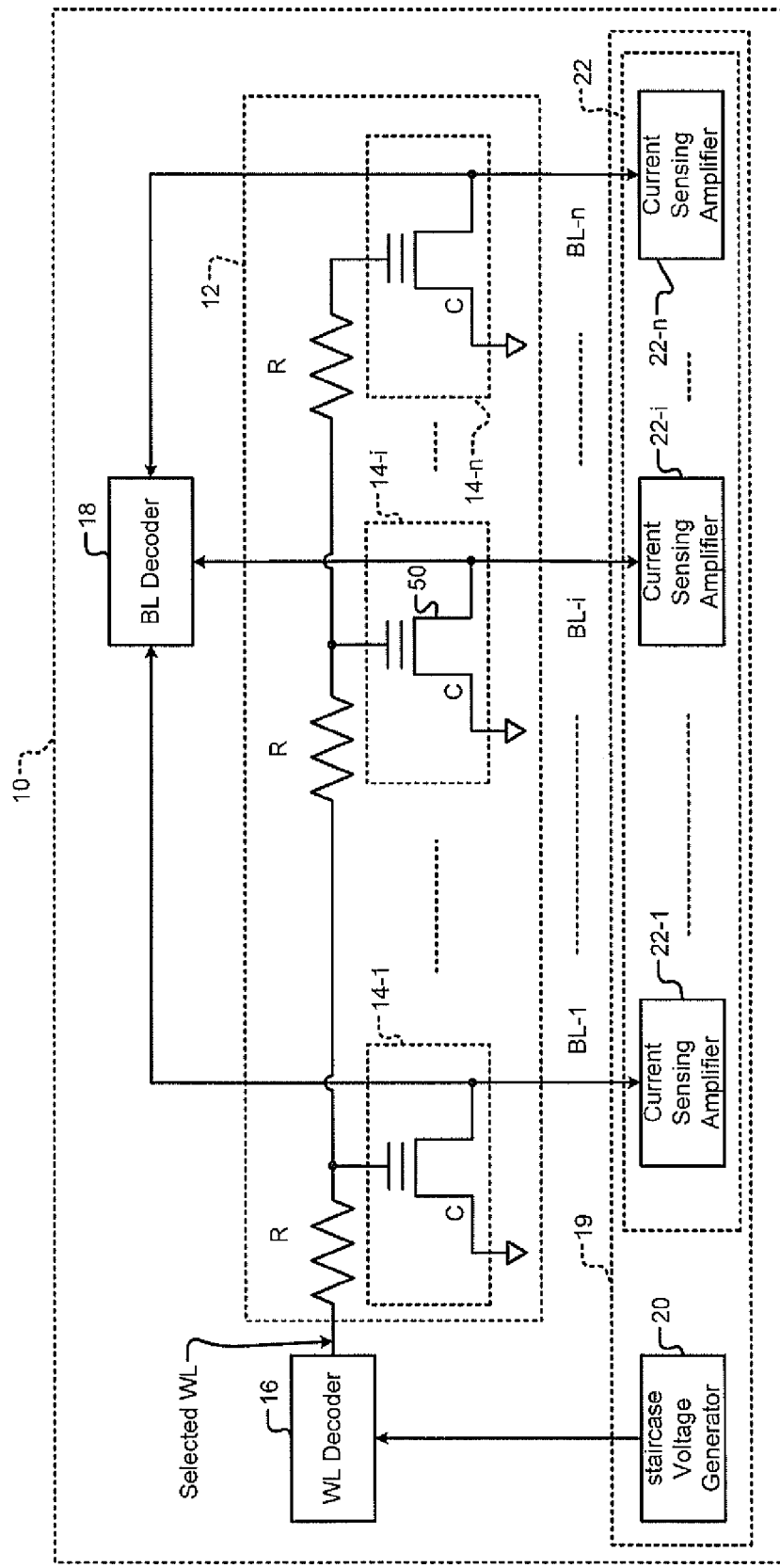
FIG. 3B is a schematic of a word line comprising the transistor of FIG. 2A according to the prior art.
Figure 3C:
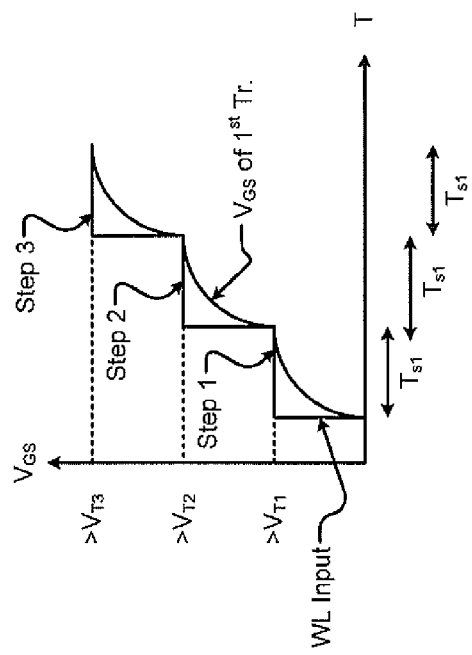
FIG. 3C is a graph of $V_{GS}$ versus time for a first transistor on the word line of FIG. 3B.
Figure 3D:
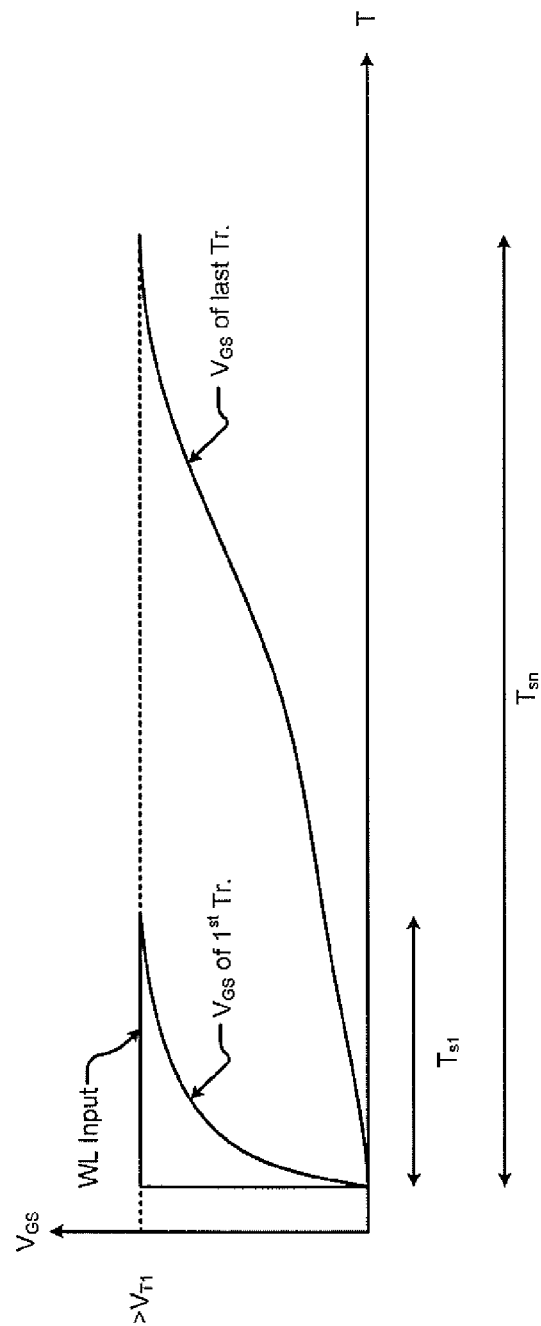
FIG. 3D is a graph of $V_{GS}$ versus time for an $N^{th}$ transistor on the word line of FIG. 3B.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Threshold voltages of programmable threshold transistors on the selected word line (WL) can be measured efficiently by inputting a linear ramp voltage instead of inputting a staircase voltage to the selected WL. The linear ramp voltage can be generated by converting digital codes generated by a counter using a digital-to-analog converter (DAC) and filtering the output of the DAC. The counter increments the digital codes to increase the ramp voltage. When the ramp voltage is greater than or equal to the threshold voltage of a transistor, the current sensing amplifier senses a high drain current through the transistor, and the digital code output by the counter to the DAC is latched into a register. The latched digital code represents a digital value of the threshold voltage of the transistor. The process of generating the digital value of the threshold voltage is called digitizing the threshold voltage.

While the ramp voltage increases, digital codes representing threshold voltages of the transistors are latched into respective registers when the current sensing amplifiers sense high drain currents through the transistors. Thus, at the end of the ramp, digital values of threshold voltages are available in the registers. That is, the threshold voltages are digitized in a single sweep of the ramp.

Using the ramp voltage instead of the staircase voltage eliminates the iterative steps of incrementing the staircase voltage, waiting for the settling time, sensing the drain current, and determining whether to continue increment the staircase voltage based on the sensed drain current. Accordingly, the threshold voltages can be measured faster by using the ramp voltage than by using the staircase voltage.

The speed of measuring the threshold voltages can be further increased by increasing the resolution of the digital code. Specifically, the time interval between successive digital codes can be reduced to less than a time constant of the word line. For example, a high-resolution linearly stepping digital code may be used. Any resulting inaccuracies in the digital values of the threshold voltages are reduced by generating correction values for each bit line using calibration. The correction codes are combined with the digital values to generate accurate digital values of the threshold voltages.

The present disclosure is organized as follows. First, a linear system model of the word line is introduced, and calibration is briefly discussed. Next, a system for digitizing threshold voltages of transistors is discussed. Thereafter, calibration is discussed in detail. Finally, use of Gray code to improve the accuracy of the system is discussed.

Figure 4:
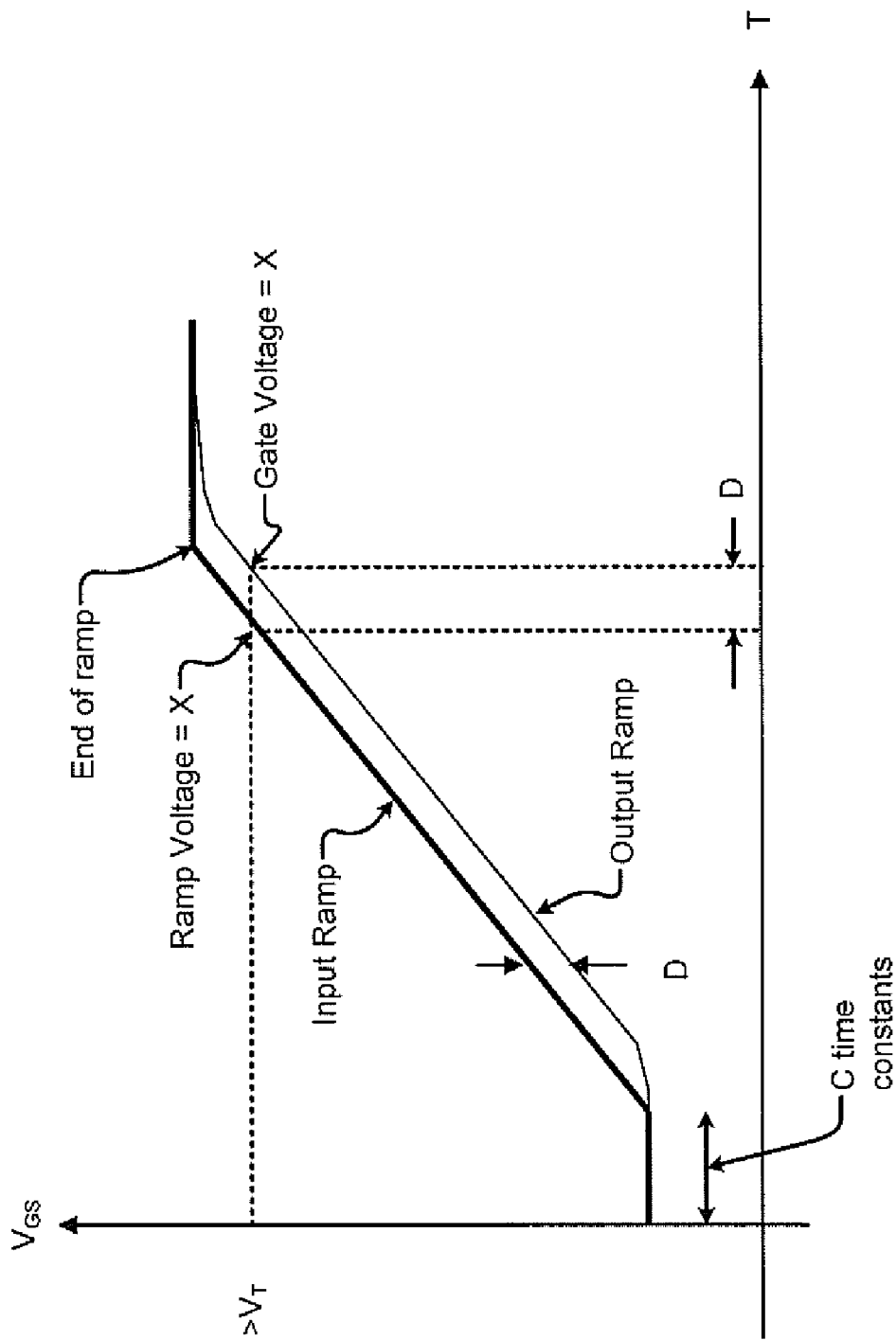
FIG. 4 is a graph of $V_{GS}$ versus time for a word line of a memory IC.

Referring now to FIG. 4, the word line may be modeled as a linear system comprising distributed RC circuits. For a linear system, a linear input ramp results in a linear output ramp. For a linear system with a unity DC gain, the linear output ramp lags the linear input ramp by a delay D. The delay D is proportional to a group delay (i.e., a time constant) of the linear system. The delay D is fixed when C time constants of the linear system have elapsed after the linear input ramp is applied to the linear system, where C is a number greater than 1.

Accordingly, a linear ramp voltage (hereinafter ramp voltage) may be applied to the selected word line C time constants before the first transistor on the selected WL turns on. A delayed ramp voltage is applied to the gate of each transistor on the word line. For example, let the threshold voltage of a transistor on the word line be $V_T$. The transistor turns on when the voltage at the gate of the transistor is at least $V_T$. The voltage at the gate of the transistor may reach $V_T$ D units of time after the ramp voltage at the input of the word line reaches $V_T$. The delay D increases as the distance of the transistor from the input of the word line increases. That is, the delay D increases as the distance between the WL decoder and the bit line (BL) that communicates with the transistor on the word line increases.

Although the delay is different for each bit line, the delay has a fixed value for each bit line at a given temperature. Accordingly, the delay can be measured and converted into the correction value using calibration. Since the delay may vary with temperature, the delay can be measured periodically based on a predetermined change in temperature of the memory integrated circuit (IC).

Subsequently, during normal read operation, when the ramp voltage is applied and the digital value for the threshold voltage of a transistor is latched, the correction value for the bit line comprising the transistor is subtracted from the latched digital value. The resulting value represents the accurate digitized value of the threshold voltage of the transistor.

Figure 5:
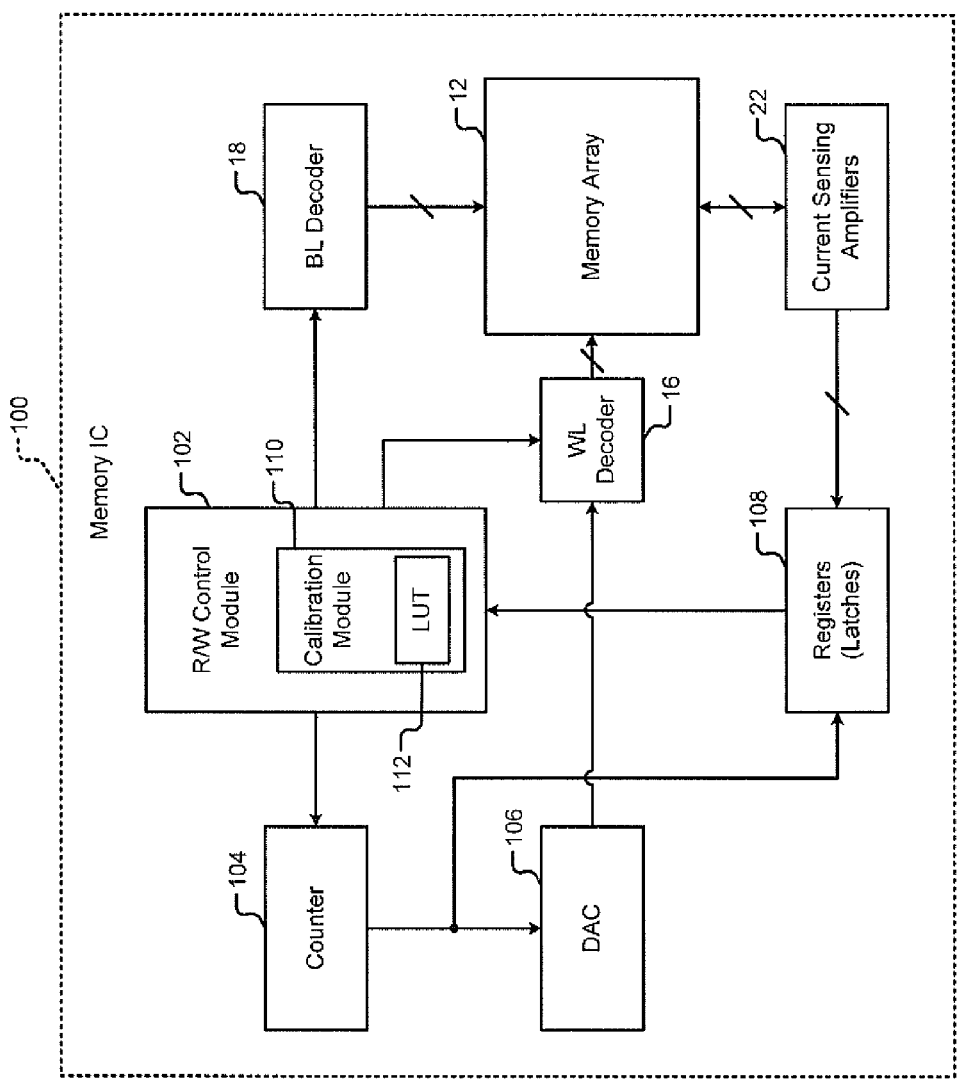
FIG. 5 is a functional block diagram of a memory IC according to the present disclosure.

Referring now to FIG. 5, a memory IC 100 that digitizes threshold voltages according to the present disclosure is shown. The IC 100 comprises the memory array 12, the WL decoder 16, the BL decoder 18, the current sensing amplifiers 22, a R/W control module 102, a counter 104, a DAC 106, and registers (latches) 108.

The R/W control module 102 initializes the counter 104 when a read operation is performed. The counter 104 counts and outputs counts based on a digital code (e.g., binary code) to the DAC 106. The DAC 106 converts the counts and generates the ramp voltage. A low-pass filter (not shown) may filter the ramp voltage and increase the linearity of the ramp voltage.

The ramp voltage is input to the WL decoder 16. The WL decoder 16 selects the WL comprising the memory cells 14 of which the state is to be determined. The WL decoder 16 inputs the ramp voltage to the selected WL C time constants before the first transistor on the selected WL can turn on. The ramp voltage is applied to the gates of the transistors on the selected WL.

The ramp voltage increases as the counter 104 increments and the count output by the counter 104 to the DAC 106 increases. While the ramp voltage increases, the current sensing amplifiers 22 sense the drain currents of the transistors via the bit lines that communicate with the transistors. When the ramp voltage output by the DAC 106 is greater than or equal to the threshold voltage of any transistor, the drain current of that transistor goes high (i.e., becomes more than the predetermined drain current). The current sensing amplifier that senses the high drain current generates a control signal called a strobe signal.

The registers 108 include one register per bit line (i.e., per transistor on the word line). Each register receives the counts output by the counter 104 to the DAC 106. Each register is strobed by the strobe signal generated by a corresponding one of the current sensing amplifiers 22. The control signal latches the count received from the counter 104 in the register. The count is a digital value of the ramp voltage that corresponds to the threshold voltage of the transistor. Accordingly, the count latched in the register represents the digitized threshold voltage of the transistor. The threshold voltages of all the transistors on the selected WL are digitized in a single sweep of the ramp voltage.

When the ramp voltage at the input of the selected WL is X at time T (after C time constants of the selected WL), the voltage at the gate of the first transistor on the word line may be X at tune $(T+D_1)$. The voltage at the gate of an $N^{th}$ transistor on the word line may be X at time $(T+D_n)$, where n>1, and $D_n>D_1$. At time $(T+D_n)$, however, the ramp voltage at the input of the word line may have increased to Y. Accordingly, when the voltage X at the gate of the $N^{th}$ transistor turns on the $N^{th}$ transistor, the voltage of the ramp may have already increased from X to Y. Thus, the count latched in the register corresponding to the $N^{th}$ transistor may be the count that generated the voltage Y and not the voltage X that turned on the $N^{th}$ transistor. In other words, the count latched in the register may not represent the accurate threshold voltage of the transistor.

Corrections to the counts latched in the registers 108 can be made by subtracting calibration codes from the counts latched in the registers 108. The calibration codes account for the fixed delays $D_1, \ldots D_n$, etc. For example, the calibration codes corresponding to the delays $D_1$ and $D_n$ may be subtracted from the counts latched in the registers for the first and $N^{th}$ transistors, respectively.

The R/W control module 102 comprises a calibration module 110 that measures the delays $D_1, \ldots, D_n$ during a calibration cycle discussed in detail below. The calibration module 110 converts the fixed delays into calibration codes and stores the calibration codes in a lookup table 112.

During normal read operations, the R/W control module 102 reads the counts latched in the registers 108 at the end of the ramp. The R/W control module 102 looks up the calibration codes in the look up table 112. The R/W control module 102 subtracts the calibration codes from the latched counts. The resulting counts represent accurate digitized values of the threshold voltages of the transistors.

The calibration module 110 may generate the calibration codes in many ways. For example, the calibration codes may be generated once when the IC 100 is manufactured, each time the IC 100 is initialized, or when read errors increase beyond a predetermined threshold during normal operation. Alternatively, since the delays vary with the temperature of the IC 100, the calibration module 110 may generate the calibration codes when the temperature of the IC 100 changes by a predetermined amount or reaches a predetermined value.

Figure 6:
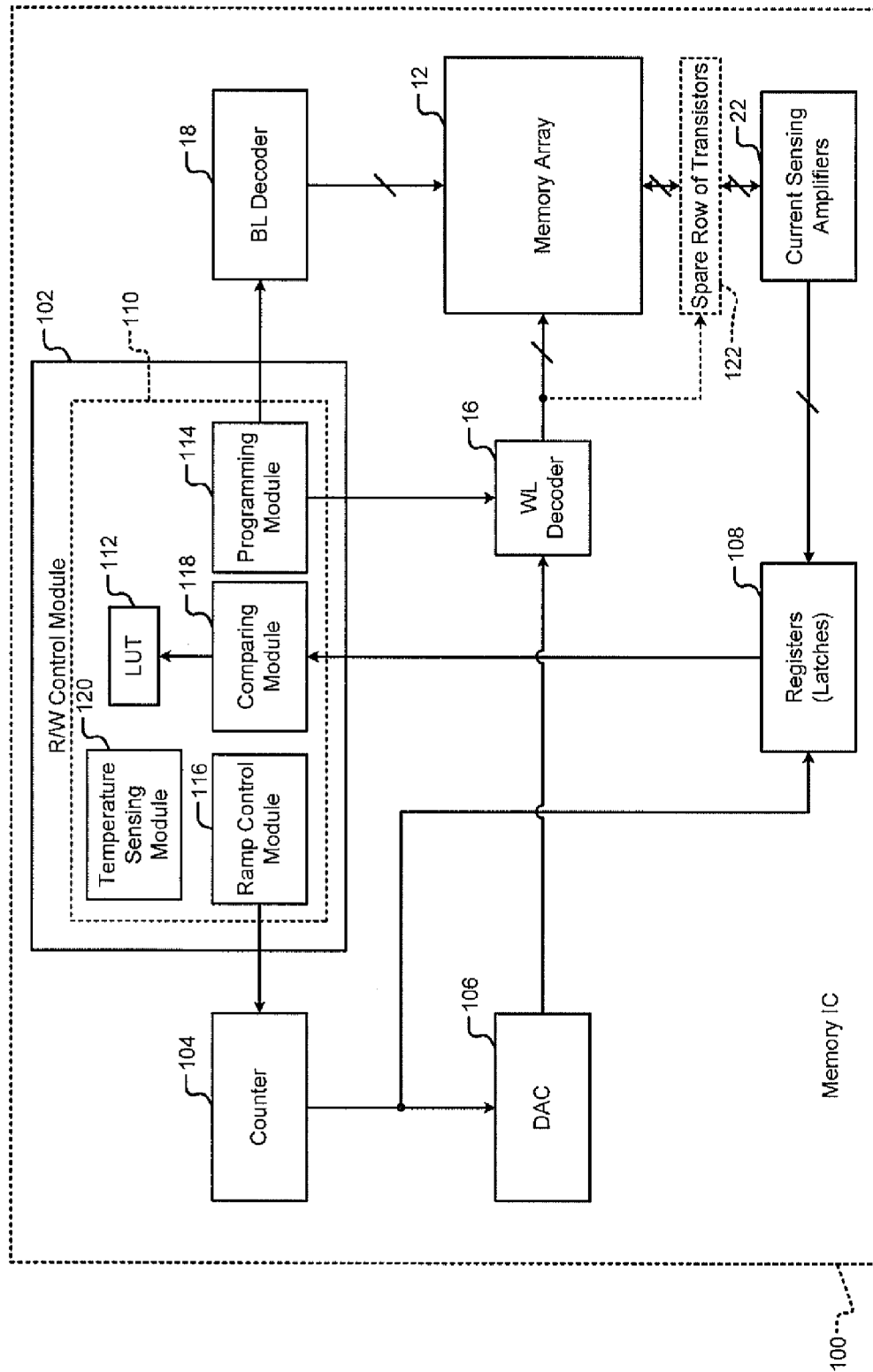
FIG. 6 is a detailed functional block diagram of the memory IC of FIG. 5.

Referring now to FIG. 6, the calibration module 110 may comprise the lookup table 112, a programming module 114, a ramp control module 116, a comparing module 118, and a temperature sensing module 120. When the calibration beings, the programming module 114 programs all the transistors on a predetermined word line of the memory array 12 to a predetermined threshold voltage. In other words, the programming module 114 may program the memory cells 14 on the predetermined word line to a predetermined state. The row of transistors on the predetermined word line may be called a reference row of transistors, and the predetermined word line may be called a reference word line.

In some implementations, the reference row may comprise a spare row 122 of transistors that is provided for calibration purposes. Using the spare row 122, the calibration can be performed while the user data is stored in the memory array 12. The spare row 122 may be incorporated outside the memory array as shown or inside the memory array (not shown). When the spare row 122 is incorporated inside the memory array 12, calibration is performed outside of normal R/W operations. The transistors of the reference row may be substantially similar to the transistors on the word lines of the memory array 12. The transistors of the reference row may, however, have lower threshold voltages than transistors of the memory array 12.

During calibration, the WL decoder 16 and the BL decoder 18 may select the transistors of the spare row 122. When the calibration beings, the programming module 114 may program all the transistors of the spare row 122 to the predetermined threshold voltage. The current sensing amplifiers 22 and the bit lines may communicate with the transistors of the spare row 122. Hereinafter, any reference to transistors during calibration includes transistors of the reference row in the memory array 12 and transistors of the spare row 122.

After programming the transistors, the ramp control module 116 decreases the rate of the ramp (ramp rate). A ramp rate is the rate at which the ramp voltage changes. For example, the ramp rate may be V volts/sec during normal operation. Accordingly, the ramp control module 116 decreases the ramp rate to less than V volts/sec during calibration.

Specifically, the ramp control module 116 slows the counting rate of the counter 104 (i.e., the rate at which the counter increments the counts). Consequently, the counter 104 may increment the codes that are output to the DAC 106 at a slower rate than during normal operation. Accordingly, the DAC 106 may generate a slower ramp voltage than during normal operation. The slower ramp voltage is input to the transistors on the predetermined word line or the spare row 122.

Due to the slower ramp rate, the delay between the ramp voltage at the input of the predetermined word line (or the spare row 122) and the gate voltage of any of the transistors is substantially zero. In other words, the gate voltage of a transistor when the transistor turns on and the ramp voltage when the count is latched are substantially the same. Accordingly, the counts latched in the registers 108 accurately represent the actual threshold voltages of the transistors. The R/W control module 102 stores the latched counts in memory.

Subsequently, the ramp control module 116 restores the ramp rate to the ramp rate during normal operation. The DAC generates the ramp voltage that is used during normal operation. The normal ramp voltage is input to the transistors on the predetermined word line (or the spare row 122). The registers 108 store the latched counts. The latched counts stored in the registers 108 include the delays $D_1, \ldots, D_n$, etc. that may occur during normal operation.

The comparing module 118 compares the latched counts stored in the memory to the latched counts stored in the registers 108 and generates differences. The differences represent the amount of correction that may be subtracted from the latched counts in the registers 108 during normal operation to generate counts that accurately represent the threshold voltages. The differences are called calibration codes. The calibration module generates one calibration code per bit line (i.e., per transistor on the word line). The calibration codes are stored in the lookup table 112.

The temperature sensing module 120 may sense the temperature of the IC 100. As the temperature of the IC increases, the resistances of the segments of the word lines may increase. Consequently, the time constants of the word lines may increase. Accordingly, the delays $D_1, \ldots, D_n$, etc. may increase, and the calibration codes may no longer be valid. The calibration codes may be regenerated to account for the effects of the changes in the temperature.

The temperature sensing module 120 may generate a control signal when the temperature of the IC 100 changes by a predetermined amount or when the temperature of the IC 100 reaches a predetermined temperature. The calibration module 110 may perform the calibration based on inputs received from the temperature sensing module 120.

Figure 7:
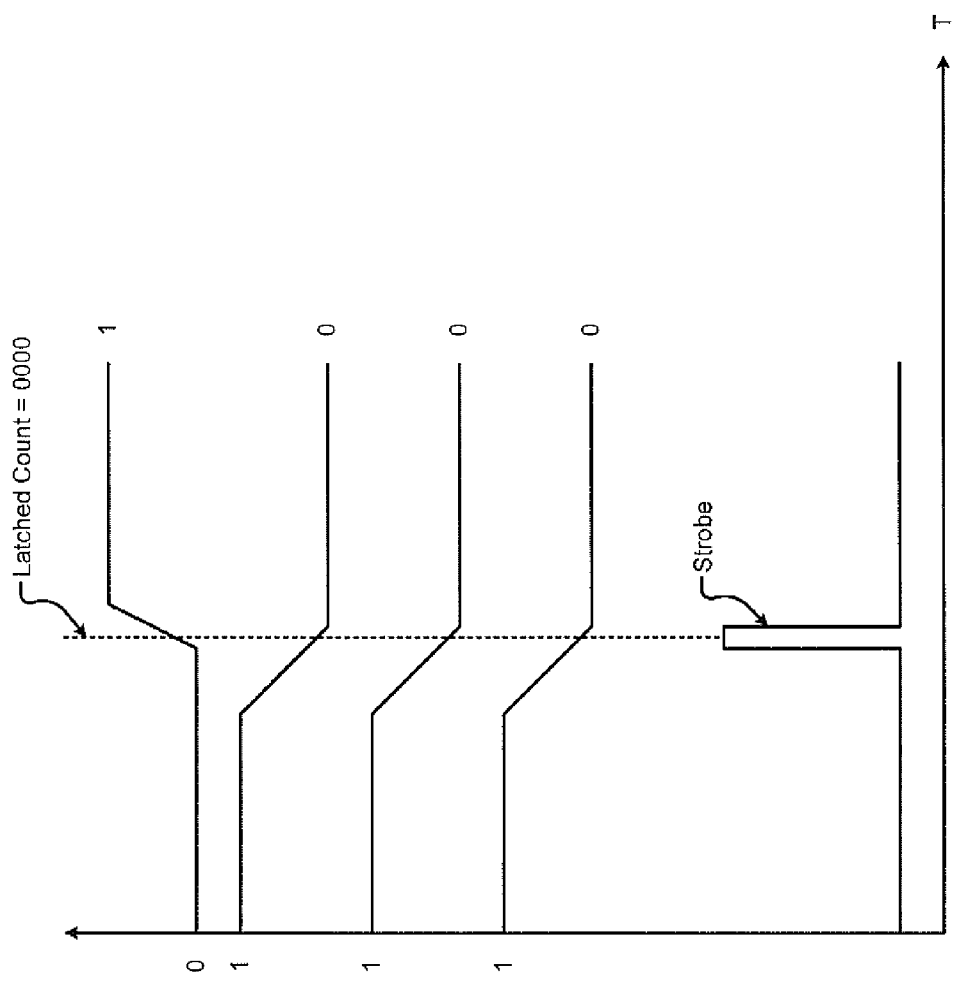
FIG. 7 is a timing diagram of signals generated by a counter and current sensing amplifiers of the memory IC of FIG. 5.

Referring now to FIG. 7, latching of the registers 108 is an asynchronous event since the current sensing amplifiers 22 generate the strobe signals to latch the registers 108 whenever the drain currents through the transistors go high. Occasionally, the count output by the counter 104 to the DAC 106 and the registers 108 may be transitioning from one count to another when the registers 108 are strobed.

For example only, the count may include 4-bit binary codewords. The count may be transitioning from a first codeword 0111 to a second 1000 when one of the registers 108 is strobed. Depending on the timing of the signals of the counter output and the strobe signal, the value of the code that may get latched may include the most significant bit (MSB) 0 of the first codeword 0111 and bits 000 of the second codeword 1000. Accordingly, the count latched in the register may be a codeword 0000 instead of the second codeword 1000. Consequently, the latched count may represent an incorrect threshold voltage.

Gray code may be used to latch correct values of the counter output in the registers 108. Gray code has a useful property that two successive values of Gray-code codewords differ in only one digit. Accordingly, the binary counts output by the counter 104 may be converted into Gray-code codewords. The Gray-code codewords may be input to the registers 108. When the strobe signals latch the Gray-code codewords into the registers 108, the latched codewords may be erroneous at most by one bit. Alternatively, the strobe signals may be synchronized with a clock that clocks the counter 104. The synchronized strobe signals may be used to latch the counter outputs into the registers 108.

Figure 8A:
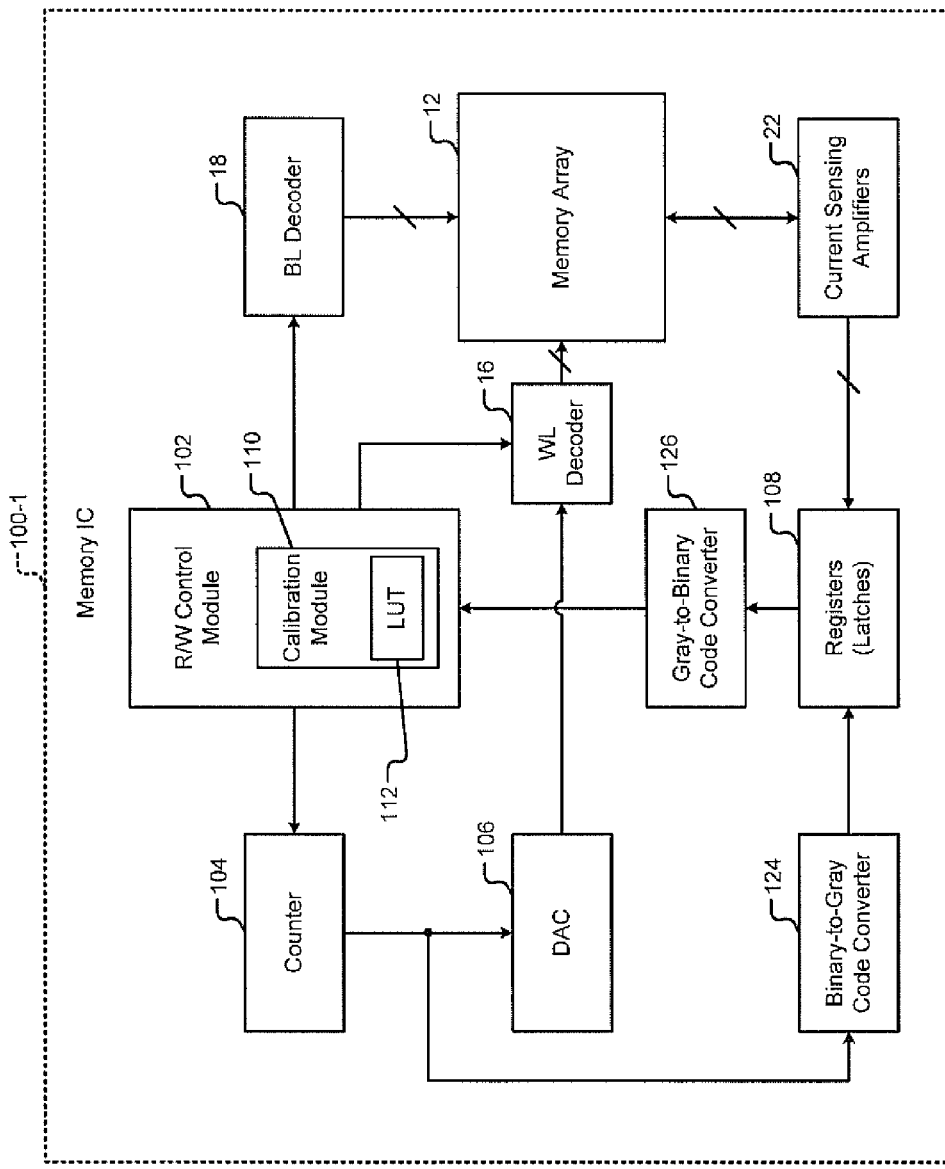
FIG. 8A is a functional block diagram of a memory IC utilizing Gray code according to the present disclosure.
Figure 8B:
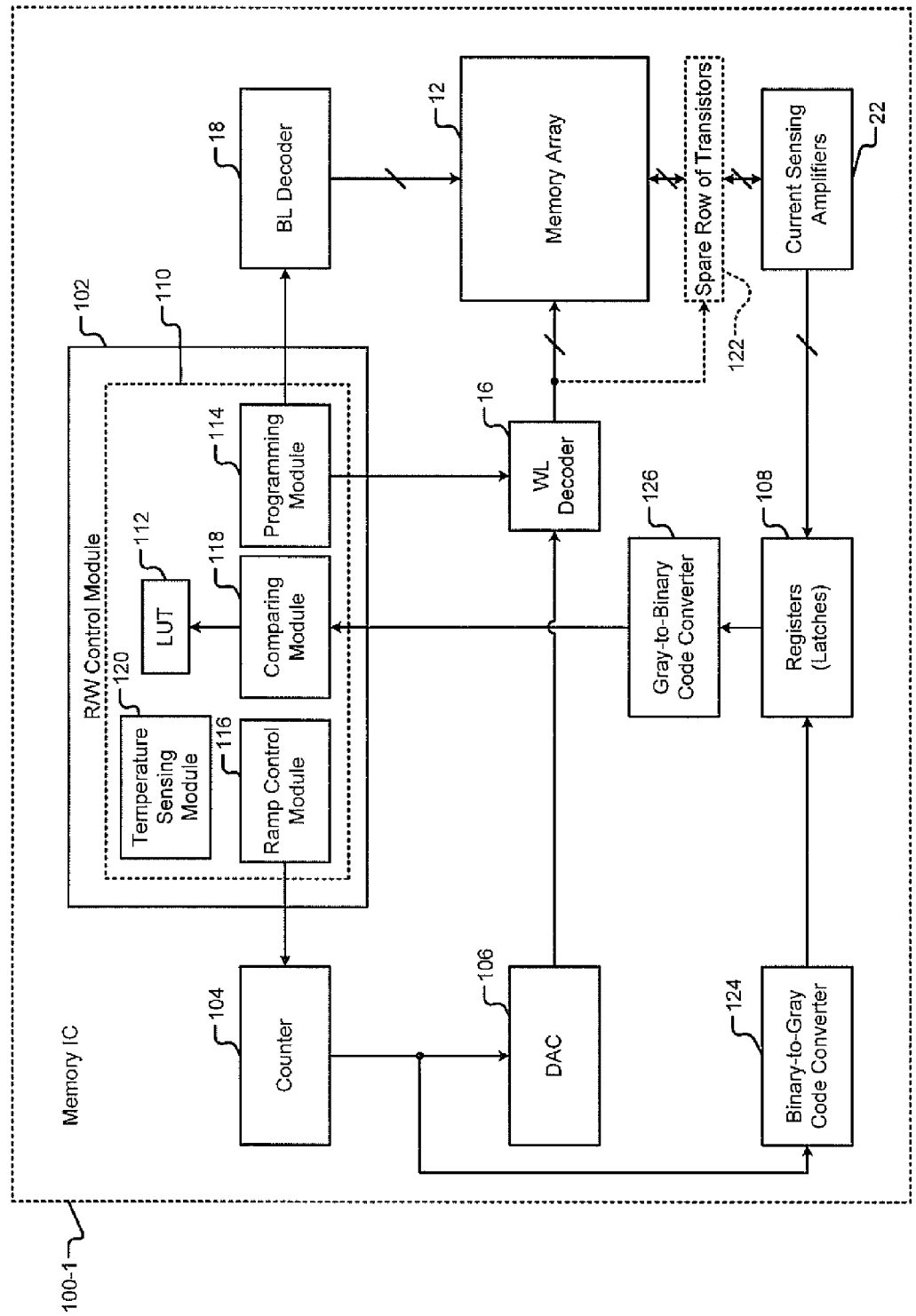
FIG. 8B is a detailed functional block diagram of the memory IC of FIG. 8A.

Referring now to FIGS. 8A and 8B, a memory IC 100-1 comprises all the components of the memory IC 100 and further comprises a binary-to-Gray code converter 124 and a Gray-to-binary code converter 126. In FIG. 8A, the binary-to-Gray code converter 124 converts the binary counts output by the counter 104 into Gray-code codewords. The Gray-code codewords are input to the registers 108. The strobe signals generated by the current sensing amplifiers 22 latch the Gray-code codewords into the registers 108. The latched codewords are equivalent to the binary counts output by the counter 104.

The Gray-to-binary code converter 126 converts the Gray-code codewords latched into the registers 108 back into binary codewords. The binary codewords are output to the R/W control module 102. During normal read operations, the R/W control module 102 looks up the calibration codes, subtracts the calibration codes from the binary codewords, and determines the digitized values of the threshold voltages.

In FIG. 8B, the binary-to-Gray code converter 124 and the Gray-to-binary code converter 126 are utilized during calibration in the same manner as during normal read operations. The operations performed by the calibration module 110 remain unchanged except that the comparing module 118 receives the latched counts from the Gray-to-binary code converter 126 instead of the registers 108.

Figure 8C:
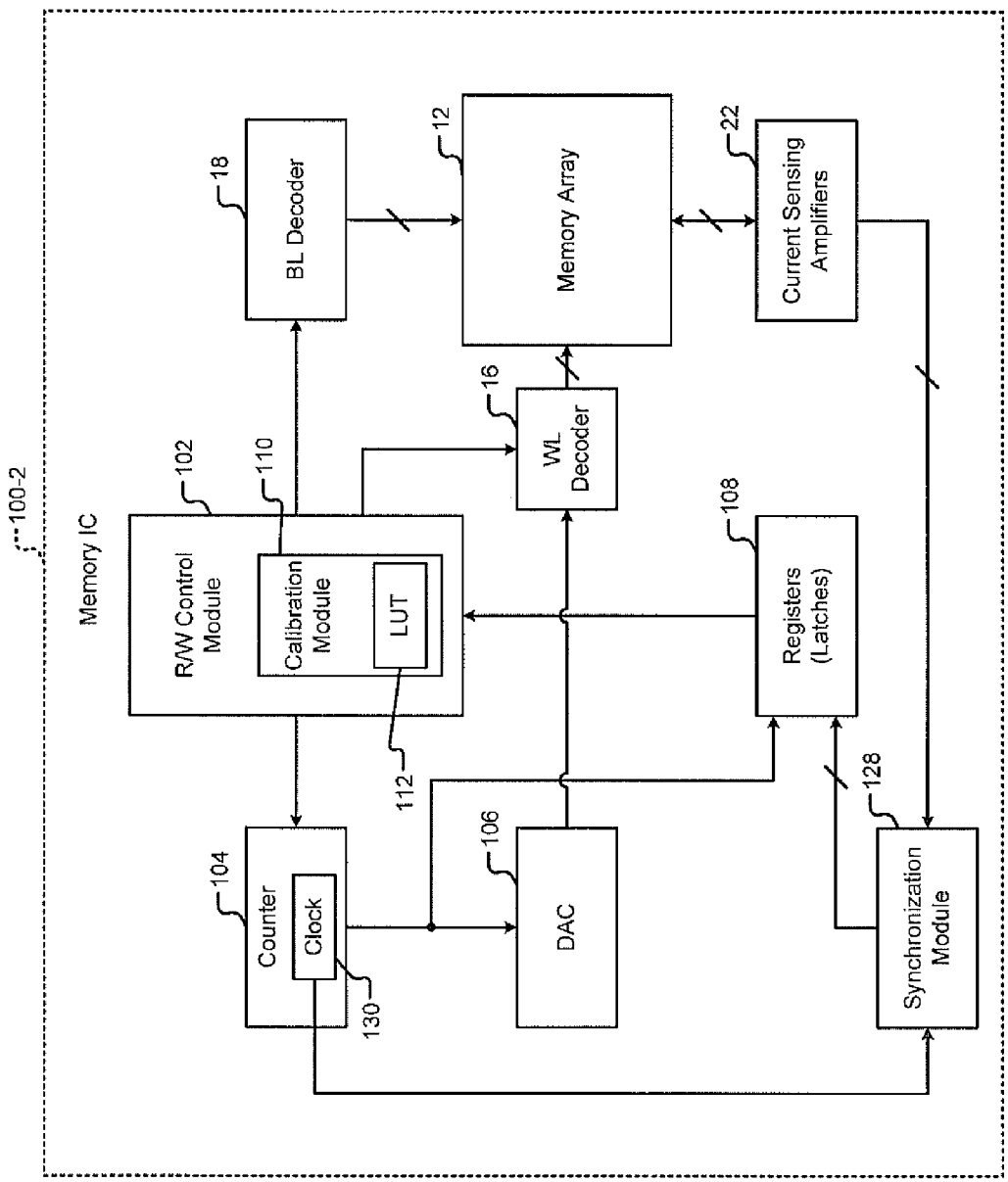
FIG. 8C is a functional block diagram of a memory IC according to the present disclosure.
Figure 8D:
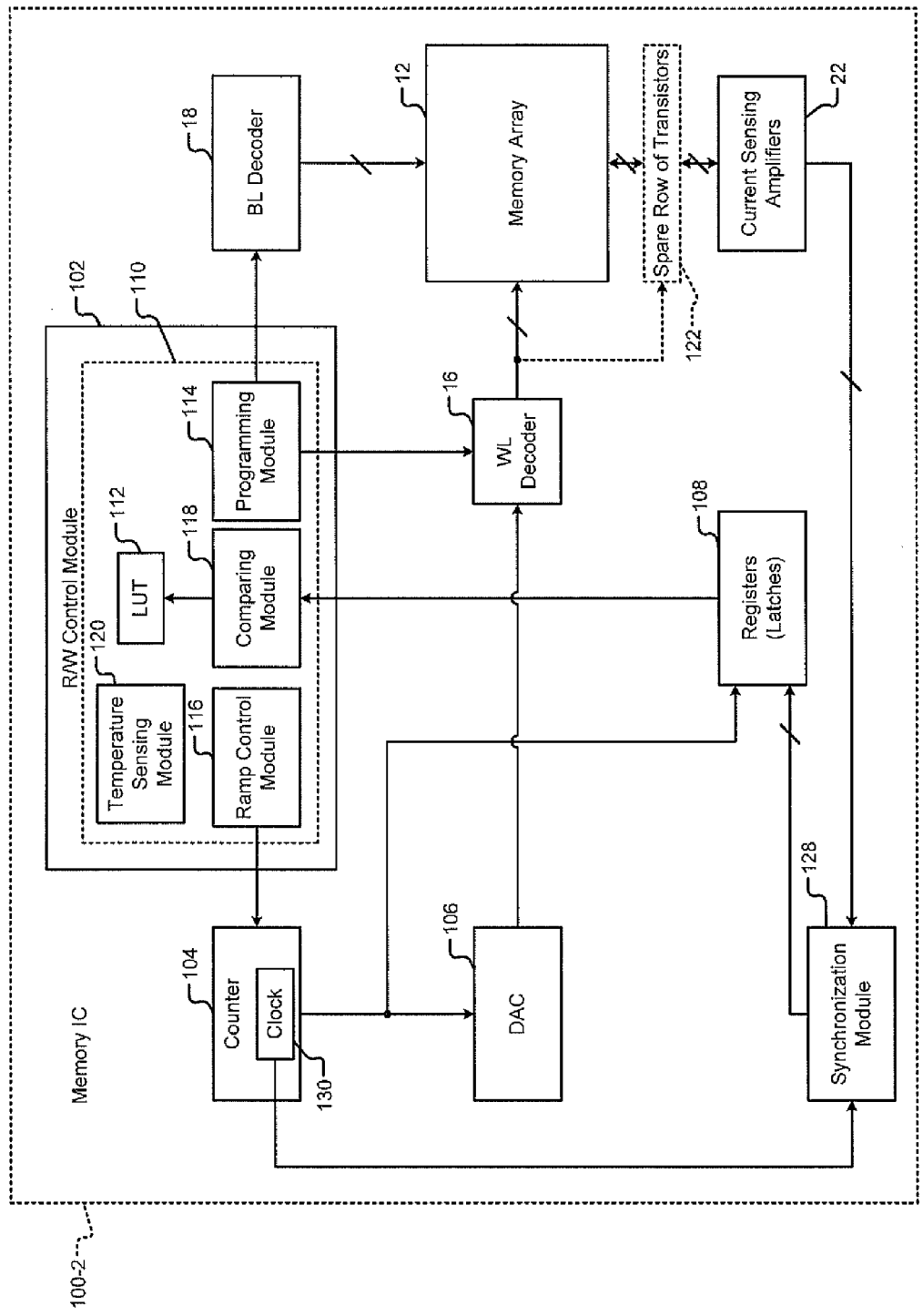
FIG. 8D is a detailed functional block diagram of the memory IC of FIG. 8C.

Referring now to FIGS. 8C and 8D, a memory IC 100-2 may use a synchronization module 128 to synchronize the strobe signals to a clock 130 that clocks and increments the counter 104. The synchronized strobe signals latch correct values of the counts output by the counter 104 into the registers 108. For example only, the synchronization module 128 may comprise flip-flops.

Figure 9:
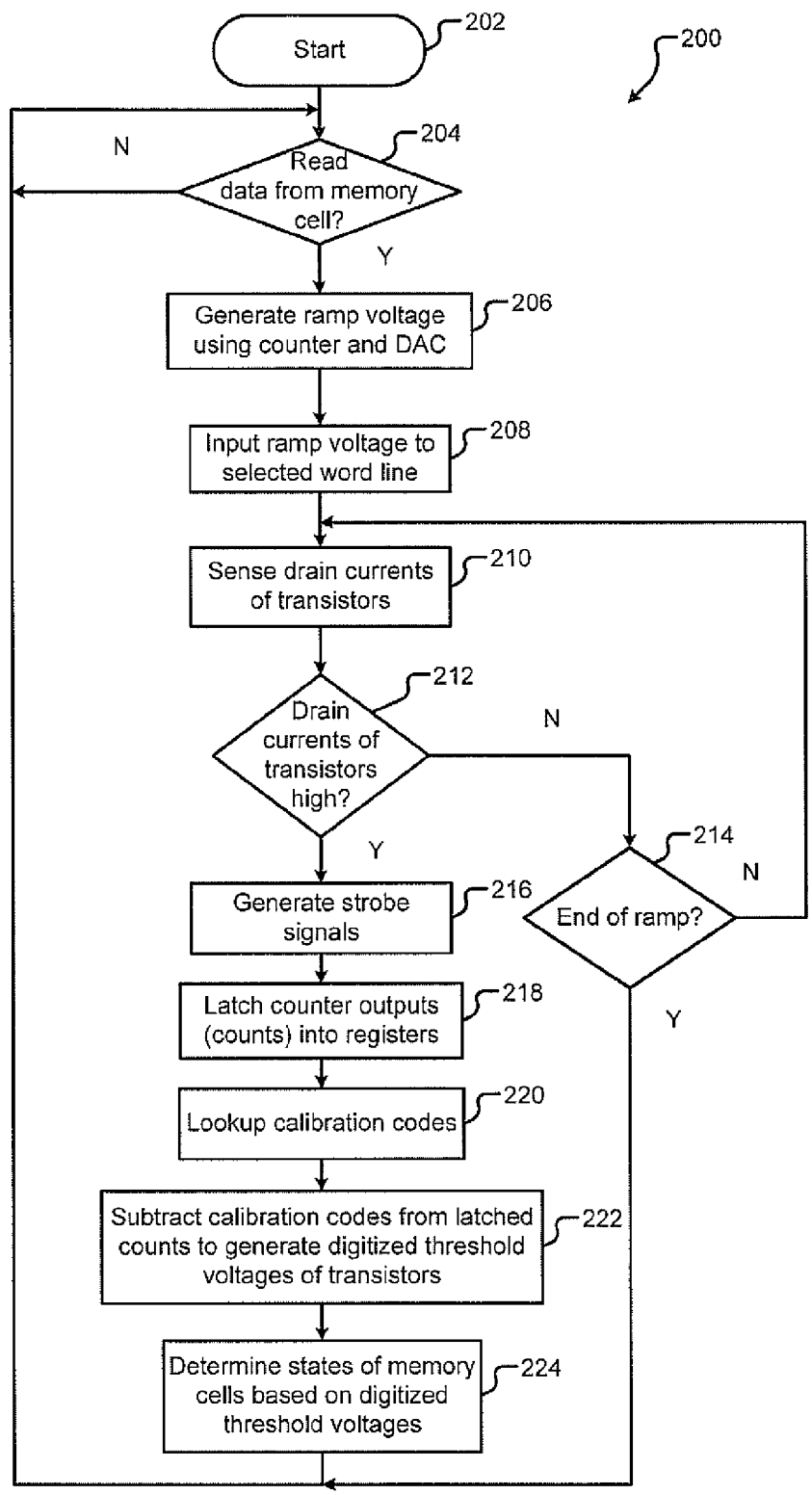
FIG. 9 is a flowchart of a method for digitizing threshold voltages of transistors according to the present disclosure.

Referring now to FIG. 9, a method 200 for digitizing threshold voltages of transistors used in memory arrays is shown. Control begins at step 202. In step 204, control determines if a read operation is to be performed. Control waits if the result of step 204 is false. If the result of step 204 is true, control generates the ramp voltage using the counter 104 and the DAC 106 in step 206. In step 208, control inputs the ramp voltage to the selected WL comprising the memory cells 14 to be read (i.e., comprising transistors of which the threshold voltages are to be digitized). Control inputs the ramp voltage C time constants before the first transistor on the selected WL can turn on.

Control senses drain currents of the transistors on the selected word line in step 210. Control determines in step 212 if the drain current of any of the transistors is high. If the result of step 212 is false, control determines in step 214 if an end of ramp is reached (i.e., if the read operation is complete). If the result of step 214 is false, control returns to step 210. If the result of step 214 is true, control returns to step 204.

If, however, the result of step 212 is true, control generates the strobe signals in step 216 when the drain currents of the transistors go high. Control latches the counts output by the counter 104 based on the strobe signals into the registers 108 in step 218. Control looks up calibration codes from the lookup table 112 in step 220. In step 222, control subtracts the calibration codes from the latched counts and generates digitized threshold voltages of the transistors. In step 224, control determines the states of the memory cells on the selected word line based on the digitized threshold voltages.

Figure 10:
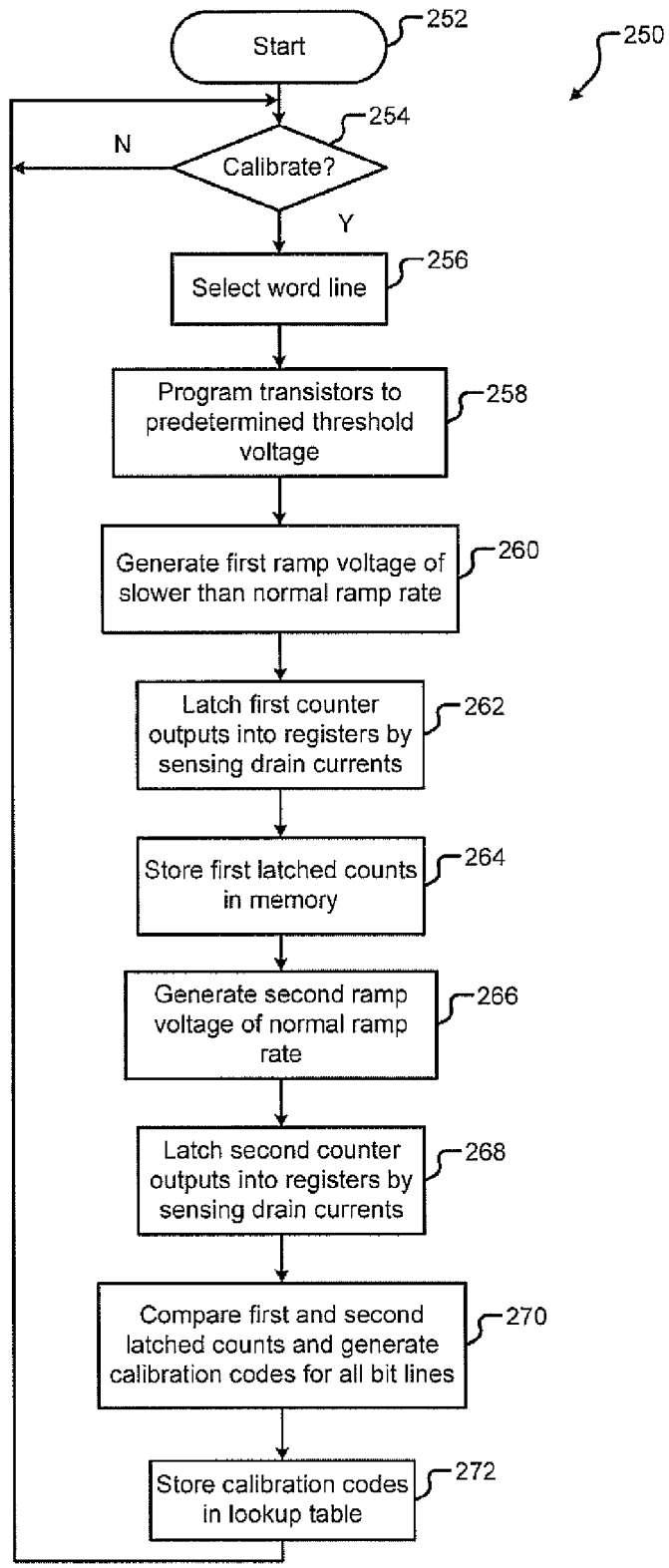
FIG. 10 is a flowchart of a method for generating correction codes that increase the accuracy of digitizing threshold voltages of transistors according to the present disclosure.

Referring now to FIG. 10, a method 250 for calibrating the delays $D_1, \ldots, D_n$, etc. is shown. Control begins at step 252. In step 254, control determines whether to begin calibration partly based on the temperature of the memory IC 100. Control waits if the result of step 254 is false. If the result of step 254 is true, control selects a word line comprising transistors (e.g., a row of memory cells 14 inside or outside the memory array 12) in step 256. Control programs the transistors on the selected word line to a predetermined threshold voltage in step 258.

In step 260, control generates a first ramp voltage having a first ramp rate that is slower than a second ramp rate used during normal read operations. In step 262, control latches first counts output by the counter 104 into the registers 108 by sensing drain currents through the transistors and generating strobe signals based on the drain currents. Control stores the first latched counts in memory in step 264.

In step 266, control generates a second ramp voltage having the second (normal) ramp rate. In step 268, control latches second counts output by the counter 104 into the registers 108 by sensing drain currents through the transistors and generating strobe signals based on the drain currents. In step 270, control compares the first latched counts from the memory to the second latched counts in the registers 108 and generates calibration codes for all of the bit lines. In step 272, control stores the calibration codes in the lookup table 112, and control returns to step 254.

Figure 11A:
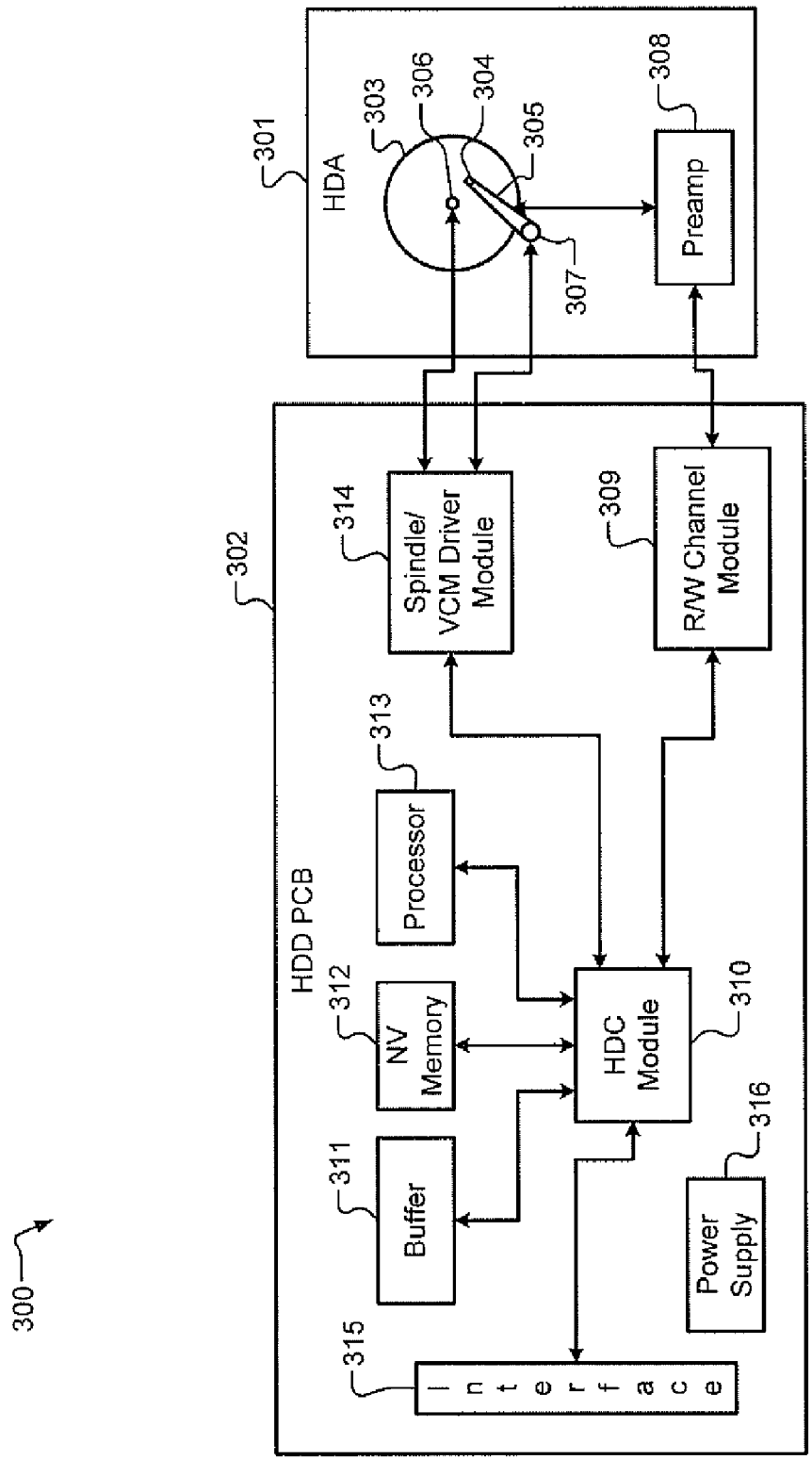
FIG. 11A is a functional block diagram of a hard disk drive.

Referring now to FIGS. 11A-11G, various exemplary implementations incorporating the teachings of the present disclosure are shown. In FIG. 11A, the teachings of the disclosure can be implemented in nonvolatile memory 312 and associated circuitry of a hard disk drive (HDD) 300. The HDD 300 includes a hard disk assembly (HDA) 301 and an HDD printed circuit board (PCB) 302. The HDA 301 may include a magnetic medium 303, such as one or more platters that store data, and a read/write device 304. The read/write device 304 may be arranged on an actuator arm 305 and may read and write data on the magnetic medium 303. Additionally, the HDA 301 includes a spindle motor 306 that rotates the magnetic medium 303 and a voice-coil motor (VCM) 307 that actuates the actuator arm 305. A preamplifier device 308 amplifies signals generated by the read/write device 304 during read operations and provides signals to the read/write device 304 during write operations.

The HDD PCB 302 includes a read/write channel module (hereinafter, "read channel") 309, a hard disk controller (HDC) module 310, a buffer 311, nonvolatile memory 312, a processor 313, and a spindle/VCM driver module 314. The read channel 309 processes data received from and transmitted to the preamplifier device 308. The HDC module 310 controls components of the HDA 301 and communicates with an external device (not shown) via an I/O interface 315. The external device may include a computer, a multimedia device, a mobile computing device, etc. The I/O interface 315 may include wireline and/or wireless communication links.

The HDC module 310 may receive data from the HDA 301, the read channel 309, the buffer 311, nonvolatile memory 312, the processor 313, the spindle/VCM driver module 314, and/or the I/O interface 315. The processor 313 may process the data, including encoding, decoding, filtering, and/or formatting. The processed data may be output to the HDA 301, the read channel 309, the buffer 311, nonvolatile memory 312, the processor 313, the spindle/VCM driver module 314, and/or the I/O interface 315.

The HDC module 310 may use the buffer 311 and/or nonvolatile memory 312 to store data related to the control and operation of the HDD 300. The buffer 311 may include DRAM, SDRAM, etc. Nonvolatile memory 312 may include any suitable type of semiconductor or solid-state memory, such as flash memory (including NAND and NOR flash memory), phase change memory, magnetic RAM, and multi-state memory, in which each memory cell has more than two states. The spindle/VCM driver module 314 controls the spindle motor 306 and the VCM 307. The HDD PCB 302 includes a power supply 316 that provides power to the components of the HDD 300.

Figure 11B:
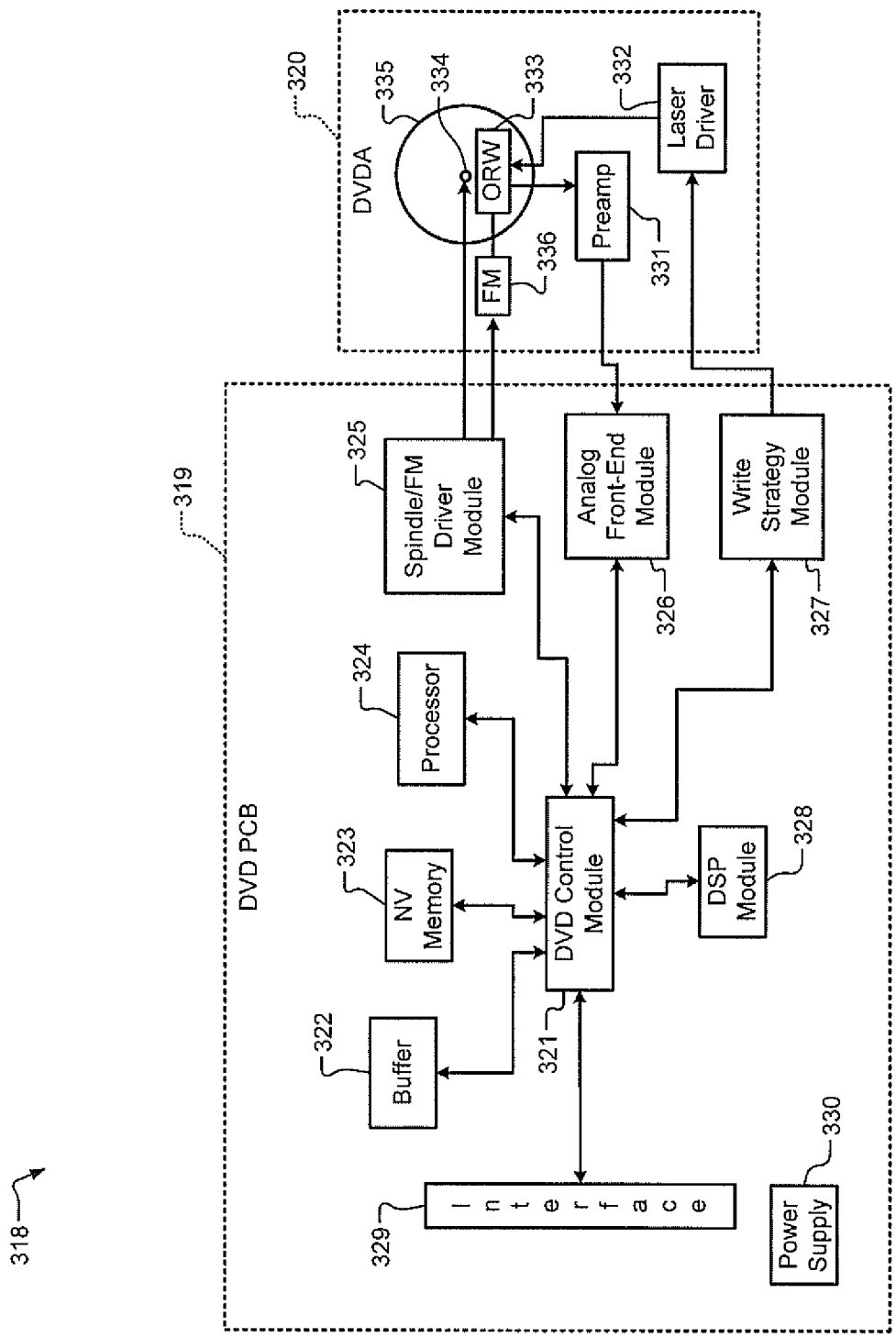
FIG. 11B is a functional block diagram of a DVD drive.

In FIG. 11B, the teachings of the disclosure can be implemented in nonvolatile memory 323 and associated circuitry of a DVD drive 318 or of a CD drive (not shown). The DVD drive 318 includes a DVD PCB 319 and a DVD assembly (DVDA) 320. The DVD PCB 319 includes a DVD control module 321, a buffer 322, nonvolatile memory 323, a processor 324, a spindle/FM (feed motor) driver module 325, an analog front-end module 326, a write strategy module 327, and a DSP module 328.

The DVD control module 321 controls components of the DVDA 320 and communicates with an external device (not shown) via an I/O interface 329. The external device may include a computer, a multimedia device, a mobile computing device, etc. The I/O interface 329 may include wireline and/or wireless communication links.

The DVD control module 321 may receive data from the buffer 322, nonvolatile memory 323, the processor 324, the spindle/FM driver module 325, the analog front-end module 326, the write strategy module 327, the DSP module 328, and/or the I/O interface 329. The processor 324 may process the data, including encoding, decoding, filtering, and/or formatting. The DSP module 328 performs signal processing, such as video and/or audio coding/decoding. The processed data may be output to the buffer 322, nonvolatile memory 323, the processor 324, the spindle/FM driver module 325, the analog front-end module 326, the write strategy module 327, the DSP module 328, and/or the I/O interface 329.

The DVD control module 321 may use the buffer 322 and/or nonvolatile memory 323 to store data related to the control and operation of the DVD drive 318. The buffer 322 may include DRAM, SDRAM, etc. Nonvolatile memory 323 may include any suitable type of semiconductor or solid-state memory, such as flash memory (including NAND and NOR flash memory), phase change memory, magnetic RAM, and multi-state memory, in which each memory cell has more than two states. The DVD PCB 319 includes a power supply 330 that provides power to the components of the DVD drive 318.

The DVDA 320 may include a preamplifier device 331, a laser driver 332, and an optical device 333, which may be an optical read/write (ORW) device or an optical read-only (OR) device. A spindle motor 334 rotates an optical storage medium 335, and a feed motor 336 actuates the optical device 333 relative to the optical storage medium 335.

When reading data from the optical storage medium 335, the laser driver provides a read power to the optical device 333. The optical device 333 detects data from the optical storage medium 335, and transmits the data to the preamplifier device 331. The analog front-end module 326 receives data from the preamplifier device 331 and performs such functions as filtering and A/D conversion. To write to the optical storage medium 335, the write strategy module 327 transmits power level and timing data to the laser driver 332. The laser driver 332 controls the optical device 333 to write data to the optical storage medium 335.

Figure 11D:
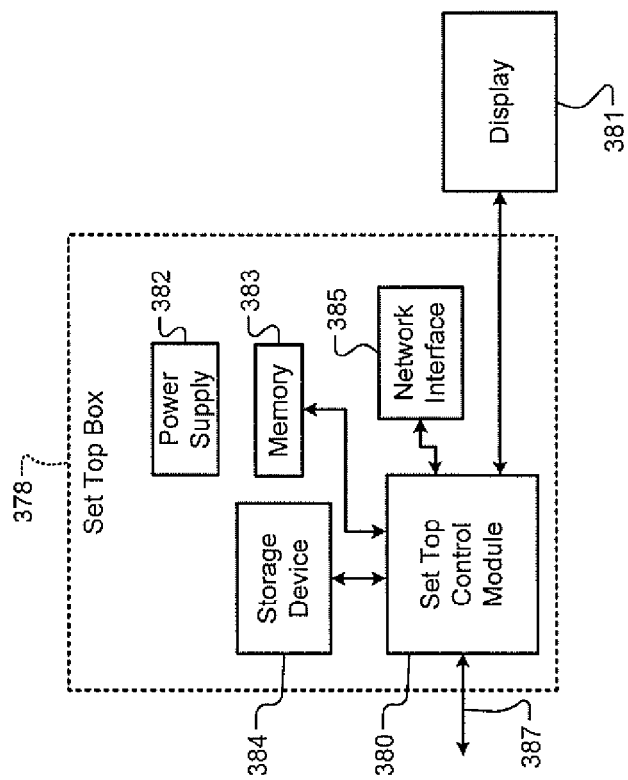
FIG. 11D is a functional block diagram of a set top box.
Figure 11C:
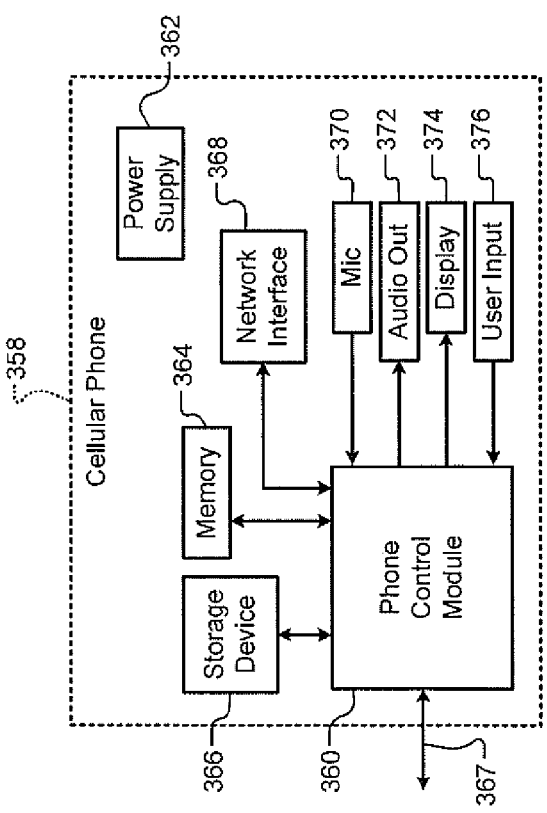
FIG. 11C is a functional block diagram of a cellular phone.

Referring now to FIG. 11C, the teachings of the disclosure can be implemented in memory 364 and associated circuitry of a cellular phone 358. The cellular phone 358 includes a phone control module 360, a power supply 362, memory 364, a storage device 366, and a cellular network interface 367. The cellular phone 358 may include a network interface 368, a microphone 370, an audio output 372 such as a speaker and/or output jack, a display 374, and a user input device 376 such as a keypad and/or pointing device. If the network interface 368 includes a wireless local area network interface, an antenna (not shown) may be included.

The phone control module 360 may receive input signals from the cellular network interface 367, the network interface 368, the microphone 370, and/or the user input device 376. The phone control module 360 may process signals, including encoding, decoding, filtering, and/or formatting, and generate output signals. The output signals may be communicated to one or more of memory 364, the storage device 366, the cellular network interface 367, the network interface 368, and the audio output 372.

Memory 364 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 366 may include an optical storage drive, such as a DVD drive, and/or a hard disk drive (HDD). The power supply 362 provides power to the components of the cellular phone 358.

In FIG. 11D, the teachings of the disclosure can be implemented in memory 383 and associated circuitry of a set top box 378. The set top box 378 includes a set top control module 380, a display 381, a power supply 382, memory 383, a storage device 384, and a network interface 385. If the network interface 385 includes a wireless local area network interface, an antenna (not shown) may be included.

The set top control module 380 may receive input signals from the network interface 385 and an external interface 387, which can send and receive data via cable, broadband Internet, and/or satellite. The set top control module 380 may process signals, including encoding, decoding, filtering, and/or formatting, and generate output signals. The output signals may include audio and/or video signals in standard and/or high definition formats. The output signals may be communicated to the network interface 385 and/or to the display 381. The display 381 may include a television, a projector, and/or a monitor.

The power supply 382 provides power to the components of the set top box 378. Memory 383 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 384 may include an optical storage drive, such as a DVD drive, and/or a hard disk drive (HDD).

Figure 11E:
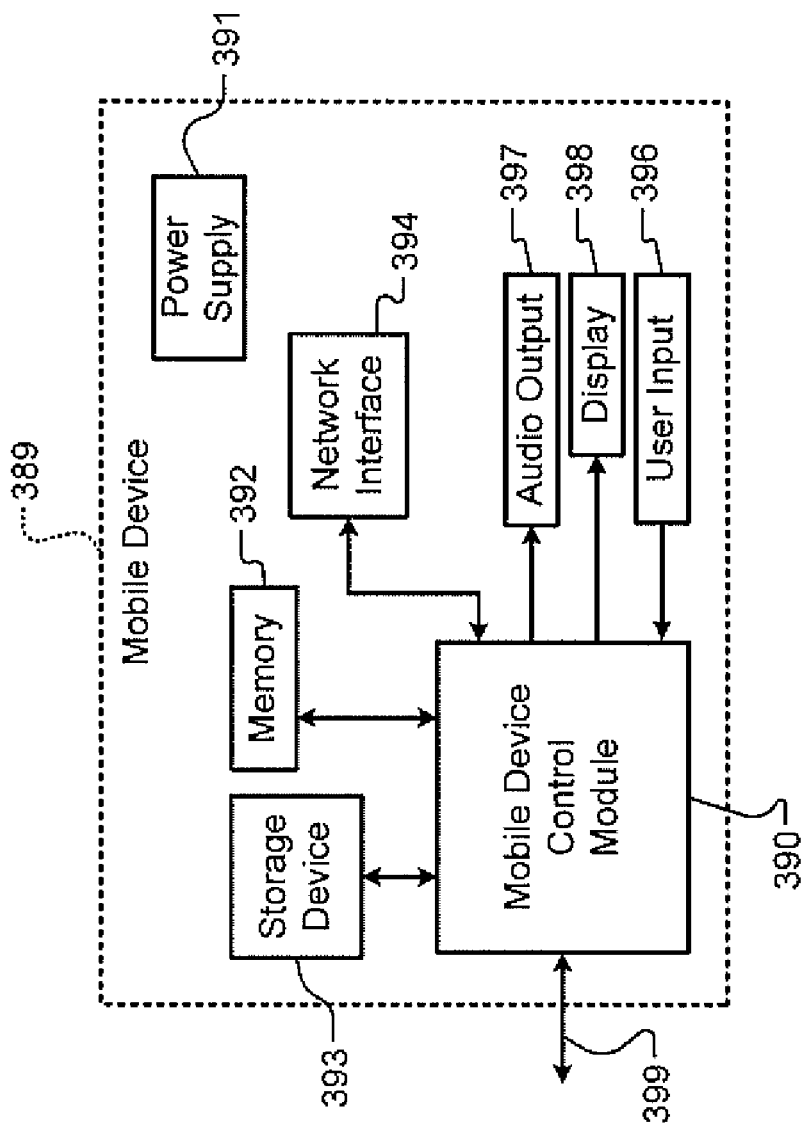
FIG. 11E is a functional block diagram of a mobile device.

In FIG. 11E, the teachings of the disclosure can be implemented in memory 392 and associated circuitry of a mobile device 389. The mobile device 389 may include a mobile device control module 390, a power supply 391, memory 392, a storage device 393, a network interface 394, and an external interface 399. If the network interface 394 includes a wireless local area network interface, an antenna (not shown) may be included.

The mobile device control module 390 may receive input signals from the network interface 394 and/or the external interface 399. The external interface 399 may include USB, infrared, and/or Ethernet. The input signals may include compressed audio and/or video, and may be compliant with the MP3 format. Additionally, the mobile device control module 390 may receive input from a user input 396 such as a keypad, touchpad, or individual buttons. The mobile device control module 390 may process input signals, including encoding, decoding, filtering, and/or formatting, and generate output signals.

The mobile device control module 390 may output audio signals to an audio output 397 and video signals to a display 398. The audio output 397 may include a speaker and/or an output jack. The display 398 may present a graphical user interface, which may include menus, icons, etc. The power supply 391 provides power to the components of the mobile device 389. Memory 392 may include random access memory (RAM) and/or nonvolatile memory.

Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 393 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A memory integrated circuit comprising:
    a memory array, wherein the memory array includes a plurality of memory cells arranged along a wordline within the memory array, and wherein each memory cell respectively comprises a transistor having a threshold voltage;
    a wordline decoder configured to input a ramp voltage to the wordline so that the ramp voltage is applied to gates of the plurality of transistors on the wordline, wherein the ramp voltage being applied to the gates of the plurality of transistors is configured to increase based on an incrementing digital code;
    a plurality of current sensing amplifiers, wherein each current sensing amplifier is respectively in communication with a corresponding transistor in the memory array along a respective bit line within the memory array, and wherein each current sensing amplifier is configured to generate a control signal in response to sensing a predetermined threshold current along the respective bitline; and
    a plurality of registers, wherein each register corresponds respectively to a corresponding transistor in the memory array, and wherein each register is configured to latch a current value of the incrementing digital code in response to the current sensing amplifier in communication with the corresponding transistor generating the control signal,
    wherein the current value of the incrementing digital code latched by each register corresponds to the threshold voltage of the corresponding transistor.

2. The memory integrated circuit of claim 1, further comprising a digital-to-analog converter configured to generate the ramp voltage in response to the incrementing digital code.

3. The memory integrated circuit of claim 1, wherein the threshold voltage of each of the plurality of transistors is obtainable in a single sweep of the ramp voltage.

4. The memory integrated circuit of claim 1, wherein the plurality of memory cells comprise NAND flash memory.

5. The memory integrated circuit of claim 1, wherein the plurality of memory cells comprise NOR flash memory.

6. The memory integrated circuit of claim 1, wherein each transistor comprises a floating-gate field-effect transistor (FET).

7. The memory integrated circuit of claim 1, wherein each transistor comprises a silicon-oxide nitride-oxide semiconductor (SONGS) transistor floating-gate field-effect transistor (FET).

8. The memory integrated circuit of claim 1, wherein the threshold voltage of each transistor is programmable to one of a plurality of different levels.

9. A method for determining a respective threshold voltage of each of a plurality of transistors in a memory array, wherein the memory array includes a plurality of memory cells arranged along a wordline within the memory array, and wherein each memory cell respectively comprises a transistor of the plurality of transistor, the method comprising:
    applying a ramp voltage to gates of the plurality of transistors on the wordline, wherein the ramp voltage being applied to the gates of the plurality of transistors is configured to increase based on an incrementing digital code;
    as the ramp voltage is being applied to the gates of the plurality of transistors, generating a respective control signal in response to sensing a predetermined threshold current along a respective bitline in the memory array, wherein each transistor in the memory array is in communication with a respective bitline in the memory array; and
    for each transistor in the memory array, latching a current value of the incrementing digital code in response to the respective control signal corresponding to the transistor being generated,
    wherein the current value of the incrementing digital code latched by each register corresponds to the threshold voltage of the corresponding transistor.

10. The method of claim 9, wherein the threshold voltage of each of the plurality of transistors is obtainable in a single sweep of the ramp voltage.

11. The method of claim 9, wherein the plurality of memory cells comprise NAND flash memory.

12. The method of claim 9, wherein the plurality of memory cells comprise NOR flash memory.

13. The method of claim 9, wherein each transistor comprises a floating-gate field-effect transistor (FET).

14. The method of claim 9, wherein each transistor comprises a silicon-oxide nitride-oxide semiconductor (SONOS) transistor floating-gate field-effect transistor (FET).

* * * * *